(12) United States Patent
Kobayashi

(10) Patent No.: US 12,337,355 B2
(45) Date of Patent: Jun. 24, 2025

(54) LIGHT-EMITTING DEVICE

(71) Applicant: FUJIFILM Business Innovation Corp., Tokyo (JP)

(72) Inventor: Takahiko Kobayashi, Ebina (JP)

(73) Assignee: FUJIFILM Business Innovation Corp., Tokyo (JP)

( * ) Notice: Subject to any disclaimer, the term of this patent is extended or adjusted under 35 U.S.C. 154(b) by 394 days.

(21) Appl. No.: 17/894,561

(22) Filed: Aug. 24, 2022

(65) Prior Publication Data

US 2023/0041654 A1 Feb. 9, 2023

Related U.S. Application Data

(63) Continuation of application No. PCT/JP2020/028697, filed on Jul. 27, 2020.

(30) Foreign Application Priority Data

Mar. 25, 2020 (JP) .................................. 2020-054932

(51) Int. Cl.
*G06K 9/00* (2022.01)
*B08B 13/00* (2006.01)
(Continued)

(52) U.S. Cl.
CPC ................ *B08B 13/00* (2013.01); *G03F 1/72* (2013.01); *G03G 15/04054* (2013.01);
(Continued)

(58) Field of Classification Search
CPC .. B08B 13/00; B08B 1/30; G03F 1/72; G03G 15/04054; G03G 21/00; G03G 2215/0409;
(Continued)

(56) References Cited

U.S. PATENT DOCUMENTS 10,459,364 B2   10/2019   Momoka et al.
2017/0315467 A1   11/2017   Bryant et al.
(Continued)

FOREIGN PATENT DOCUMENTS

JP   2007-072321 A   3/2007
JP   2007-130789 A   5/2007
(Continued)

OTHER PUBLICATIONS

Aug. 25, 2020 International Search Report issued in International Patent Application No. PCT/JP2020/028697.
(Continued)

*Primary Examiner* — Xin Jia
(74) *Attorney, Agent, or Firm* — Oliff PLC

(57) ABSTRACT

A light-emitting device includes: a first light-emitting unit that extends in one direction and has a first emission surface located along the one direction, the first emission surface emitting light; a second light-emitting unit that is located in the one direction with respect to the first light-emitting unit, that extends in the one direction, and that has a second emission surface located along the one direction, the second emission surface emitting light; a first cleaning unit that is capable of moving in the one direction and an opposite direction that is opposite to the one direction to clean the first emission surface; a second cleaning unit that is capable of moving in the one direction and the opposite direction to clean the second emission surface; and a transmission unit that extends from the first cleaning unit and the second cleaning unit in the one direction and that transmits a moving force for moving the first cleaning unit and the second cleaning unit to the first cleaning unit and the second cleaning unit.

19 Claims, 12 Drawing Sheets

(51) Int. Cl.
*G03F 1/72* (2012.01)
*G03G 15/04* (2006.01)
*G03G 21/00* (2006.01)

(52) U.S. Cl.
CPC ..... *G03G 21/00* (2013.01); *G03G 2215/0409* (2013.01); *G03G 2221/0005* (2013.01)

(58) Field of Classification Search
CPC ..... G03G 2221/0005; B41J 2/447; B41J 2/45; B41J 2/455
See application file for complete search history.

(56) References Cited

U.S. PATENT DOCUMENTS

2018/0364608 A1\* 12/2018 Momoka ............ G03G 21/1666
2020/0050139 A1\* 2/2020 Takezawa ........ G03G 15/04072

FOREIGN PATENT DOCUMENTS

JP 2008-238415 A 10/2008
JP 2019-003113 A 1/2019

OTHER PUBLICATIONS

Aug. 25, 2020 Written Opinion of the International Searching Authority issued in International Patent Application No. PCT/JP2020/028697.

\* cited by examiner

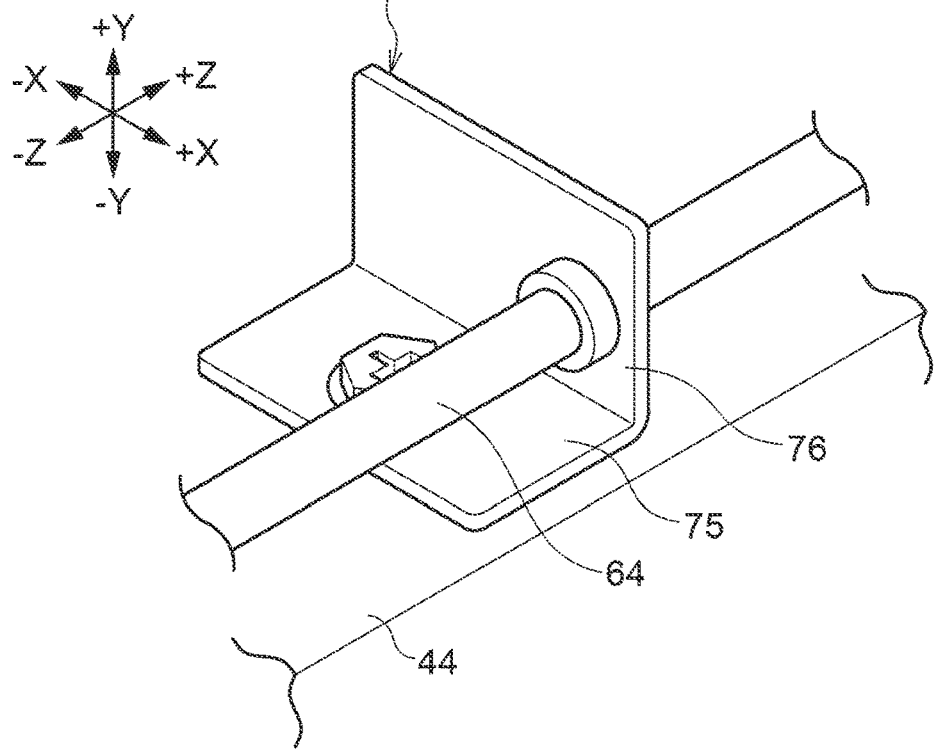
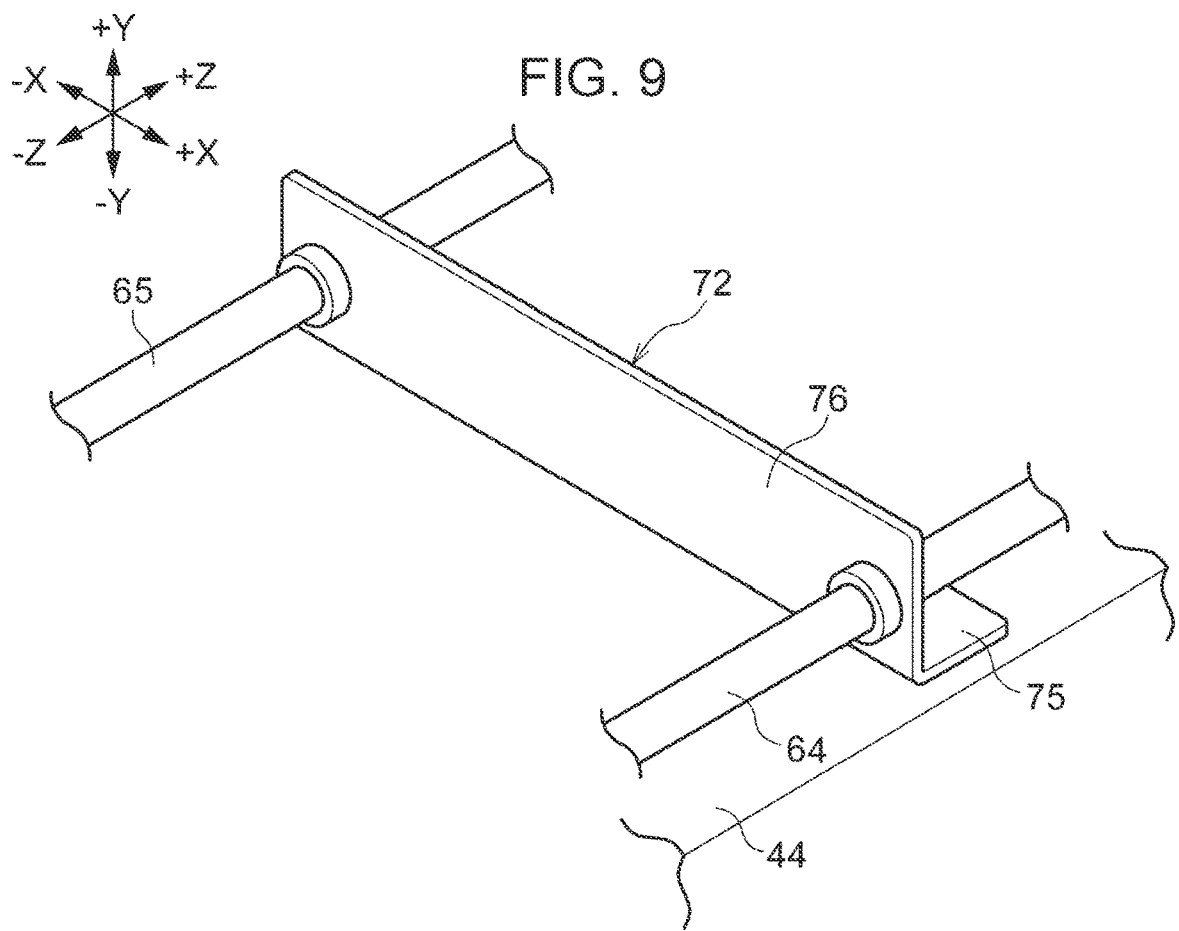

LIGHT-EMITTING DEVICE

CROSS-REFERENCE TO RELATED APPLICATIONS

This is a continuation of International Application No. PCT/JP2020/028697 filed on Jul. 27, 2020, and claims priority from Japanese Patent Application No. 2020-054932 filed on Mar. 25, 2020.

BACKGROUND

(i) Technical Field

The present disclosure relates to a light-emitting device.

(ii) Related Art

Japanese Unexamined Patent Application Publication No. 2007-130789 describes a structure including a support member that moves in a longitudinal direction of a light-emitting diode (LED) print head so that a blade member cleans a light-emitting surface. The support member moves while contact parts thereof are in contact with a photoconductor drum.

Summary

An example of a light-emitting device may have a structure including a first light-emitting unit that has a first emission surface located along one direction, the first emission surface emitting light, and a second light-emitting unit that has a second emission surface located along the one direction, the second emission surface emitting light. This structure will be hereinafter referred to as "structure A".

In structure A, when the first emission surface and the second emission surface are each provided with an independent cleaning mechanism, the first and second emission surfaces need to be cleaned independently of each other.

Aspects of non-limiting embodiments of the present disclosure relate to a structure in which the first and second emission surfaces may be cleaned together.

Aspects of certain non-limiting embodiments of the present disclosure overcome the above disadvantages and/or other disadvantages not described above. However, aspects of the non-limiting embodiments are not required to overcome the disadvantages described above, and aspects of the non-limiting embodiments of the present disclosure may not overcome any of the disadvantages described above.

According to an aspect of the present disclosure, there is provided a light-emitting device including: a first light-emitting unit that extends in one direction and that has a first emission surface located along the one direction, the first emission surface emitting light; a second light-emitting unit that is located in the one direction with respect to the first light-emitting unit, that extends in the one direction, and that has a second emission surface located along the one direction, the second emission surface emitting light; a first cleaning unit that is capable of moving in the one direction and an opposite direction that is opposite to the one direction to clean the first emission surface; a second cleaning unit that is capable of moving in the one direction and the opposite direction to clean the second emission surface; and a transmission unit that extends from the first cleaning unit and the second cleaning unit in the one direction and that transmits a moving force for moving the first cleaning unit and the second cleaning unit to the first cleaning unit and the second cleaning unit.

BRIEF DESCRIPTION OF THE DRAWINGS

Exemplary embodiments of the present disclosure will be described in detail based on the following figures, wherein:

FIG. 8 is a perspective view of a support part included in the exposure device according to the first exemplary embodiment;

FIG. 9 is a perspective view of another support part included in the exposure device according to the first exemplary embodiment;

DETAILED DESCRIPTION

Exemplary embodiments of the present disclosure will be described with reference to the drawings.

First Exemplary Embodiment

Image Forming Apparatus 10

Figure 1:
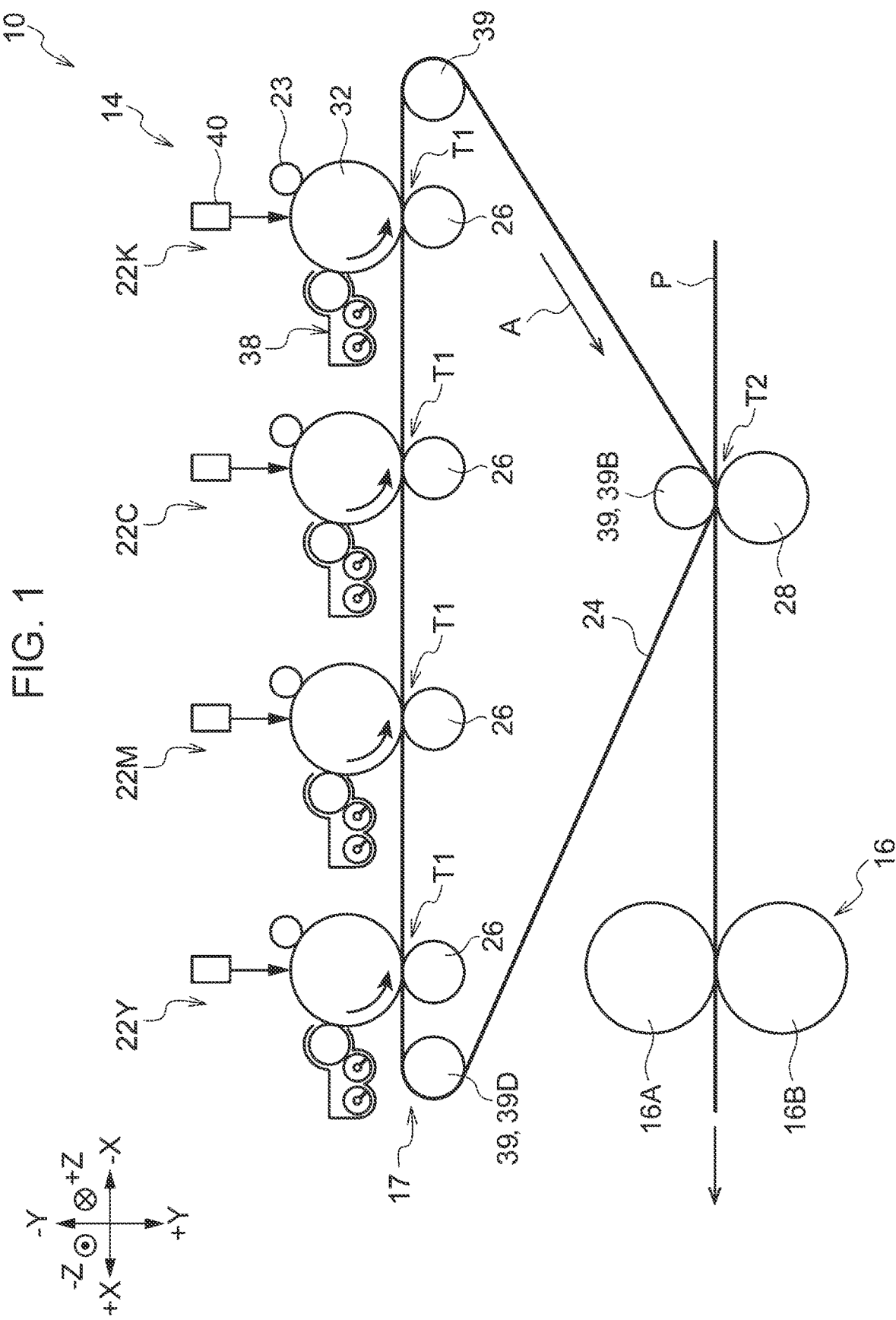
FIG. 1 is a schematic diagram illustrating an image forming apparatus including exposure devices according to a first exemplary embodiment.

The structure of an image forming apparatus 10 including exposure devices 40 according to a first exemplary embodiment will now be described. FIG. 1 is a schematic diagram illustrating the structure of the image forming apparatus 10 according to the present exemplary embodiment. In the following description, a +X direction, a −X direction, a +Y direction, a −Y direction, a +Z direction, and a −Z direction are defined as directions shown by the arrows in the drawings. In addition, in the following description, an "X direction" without + or − may mean "both +X and −X directions" or "either one of +X and −X directions"; a "Y direction" without + or − may mean "both +Y and −Y directions" or "either one of +Y and −Y directions"; and a "Z direction" without + or − may mean "both +Z and −Z directions" or "either one of +Z and −Z directions". The X direction, the Y direction, and the Z direction cross each other (more specifically, are orthogonal to each other).

In the drawings, a circle with an X in the middle represents an arrow going into the page, and a circle with a dot in the middle represents an arrow coming out of the page. Dimensional ratios between portions of components illustrated in the drawings in the X, Y, and Z directions and dimensional ratios between the components in the X, Y, and Z dimensions may differ from the actual ratios.

The image forming apparatus 10 illustrated in FIG. 1 is an example of an image forming apparatus that forms an image on a recording medium. More specifically, the image forming apparatus 10 is an electrophotographic image forming apparatus that forms a toner image (example of an image) on a recording medium P. The toner is an example of powder.

Still more specifically, the image forming apparatus 10 may form a multiple-color image. The image forming apparatus 10 may be a full-color printer for commercial printing required to form a particularly high-quality image. The image forming apparatus 10 is a wide image forming apparatus capable of forming an image on a recording medium P having a large medium width (that is, dimension in the Z direction). More specifically, the image forming apparatus 10 is capable of forming an image on a recording medium P having a width greater than a medium width of a longitudinally fed B3-size sheet (that is, greater than 364 mm). Still more specifically, for example, the image forming apparatus 10 is capable of forming an image on a recording medium P having a width greater than or equal to a medium width of a longitudinally fed A2-size sheet (that is, 420 mm) and less than or equal to a medium width of a transversely fed B0-size sheet (that is, 1456 mm). In the present exemplary embodiment, the image forming apparatus 10 is capable of forming an image on a recording medium P having a width equal to a medium width of, for example, a transversely fed B2-size sheet (that is, 728 mm).

The image forming apparatus 10 includes an image forming unit 14 and a fixing device 16. The components (the image forming unit 14 and the fixing device 16) of the image forming apparatus 10 will now be described.

Image Forming Unit 14

The image forming unit 14 has a function of forming toner images on a recording medium P. More specifically, the image forming unit 14 includes toner-image forming units (22Y, 22M, 22C, and 22K) and a transfer device 17.

Toner-Image Forming Units 22 (22Y, 22M, 22C, and 22K)

The toner-image forming units 22 illustrated in FIG. 1 are provided to form toner images of respective colors. In the present exemplary embodiment, four toner-image forming units 22 of respective colors, which are yellow (Y), magenta (M), cyan (C), and black (K), are provided. In FIG. 1, the letters Y, M, C, and K represent the respective colors.

The toner-image forming units 22 of the respective colors have similar structures except for the toners used therein. Therefore, in FIG. 1, only components of the toner-image forming unit 22K, which serves as a representative example of the toner-image forming units 22 of the respective colors, are denoted by reference numerals.

Each of the toner-image forming units 22 of the respective colors includes a photoconductor drum 32 that rotates in one direction (for example, counterclockwise in FIG. 1). Each of the toner-image forming units 22 of the respective colors also includes a charging device 23, an exposure device 40, and a developing device 38.

In each of the toner-image forming units 22 of the respective colors, the charging device 23 charges the photoconductor drum 32. The photoconductor drum 32 charged by the charging device 23 is exposed to light by the exposure device 40, so that an electrostatic latent image is formed on the photoconductor drum 32. The electrostatic latent image formed on the photoconductor drum 32 by the exposure device 40 is developed by the developing device 38, so that a toner image is formed. The structure of the exposure device 40 will be described in detail below.

Transfer Device 17

The transfer device 17 illustrated in FIG. 1 transfers the toner images formed by the toner-image forming units 22 to the recording medium P. More specifically, the transfer device 17 performs a first transfer process in which the toner images on the photoconductor drums 32 of the respective colors are transferred to a transfer belt 24, which serves as an intermediate transfer body, in a superposed manner. Then, the transfer device 17 performs a second transfer process in which the superposed toner images are transferred to the recording medium P. As illustrated in FIG. 1, the transfer device 17 includes a transfer belt 24, first transfer rollers 26, and a second transfer roller 28.

The first transfer rollers 26 transfer the toner images on the photoconductor drums 32 of the respective colors to the transfer belt 24 at first transfer positions T1 between the photoconductor drums 32 and the first transfer rollers 26. In the present exemplary embodiment, a first transfer electric field is applied between each of the first transfer rollers 26 and the corresponding one of the photoconductor drums 32, so that the toner images formed on the photoconductor drums 32 are transferred to the transfer belt 24 at the first transfer positions T1.

The toner images are transferred from the photoconductor drums 32 of the respective colors to an outer peripheral surface of the transfer belt 24. As illustrated in FIG. 1, the transfer belt 24 is loop-shaped and is positioned by being wrapped around plural rollers 39. A driving roller 39D, which is one of the rollers 39, may be rotated by a drive unit (not shown) to rotate the transfer belt 24 in the direction of arrow A. Referring to FIG. 1, the rollers 39 also include an opposing roller 39B that opposes the second transfer roller 28.

The second transfer roller 28 transfers the toner images that have been transferred to the transfer belt 24 to the recording medium P at a second transfer position T2 between the opposing roller 39B and the second transfer roller 28. In the present exemplary embodiment, a second transfer electric field is applied between the opposing roller 39B and the second transfer roller 28 so that the toner images that have been transferred to the transfer belt 24 are transferred to the recording medium P at the second transfer position T2.

Fixing Device 16

The fixing device 16 illustrated in FIG. 1 fixes the toner images that have been transferred to the recording medium P by the second transfer roller 28 to the recording medium P. More specifically, as illustrated in FIG. 1, the fixing device 16 includes a heating roller 16A that serves as a heating member and a pressing roller 16B that serves as a pressing member. The heating roller 16A and the pressing roller 16B of the fixing device 16 respectively apply heat and pressure to the recording medium P so that the toner images on the recording medium P are fixed to the recording medium P.

Exposure Device 40

Figure 2:
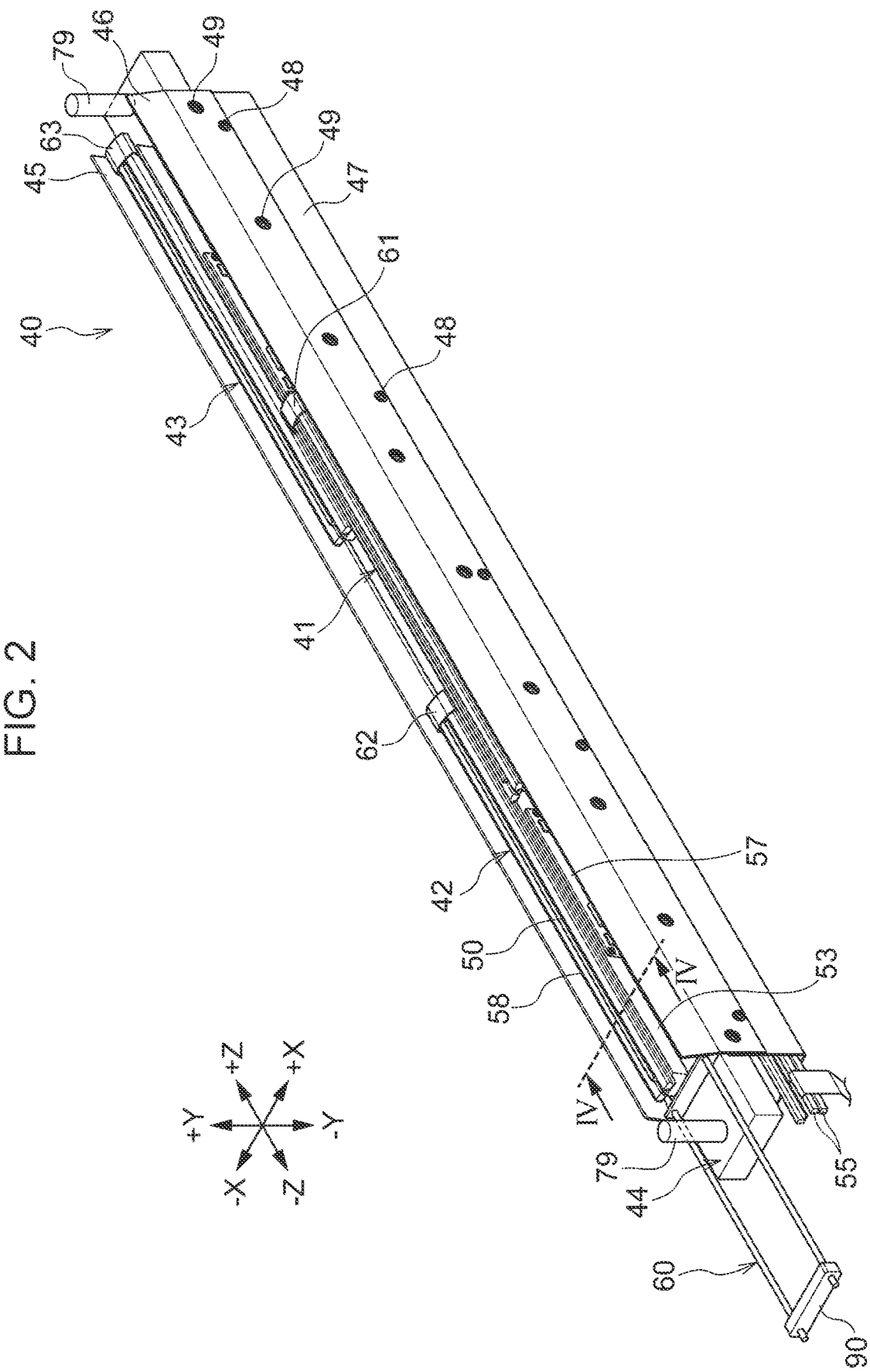
FIG. 2 is a perspective view of an exposure device according to the first exemplary embodiment.
Figure 3:
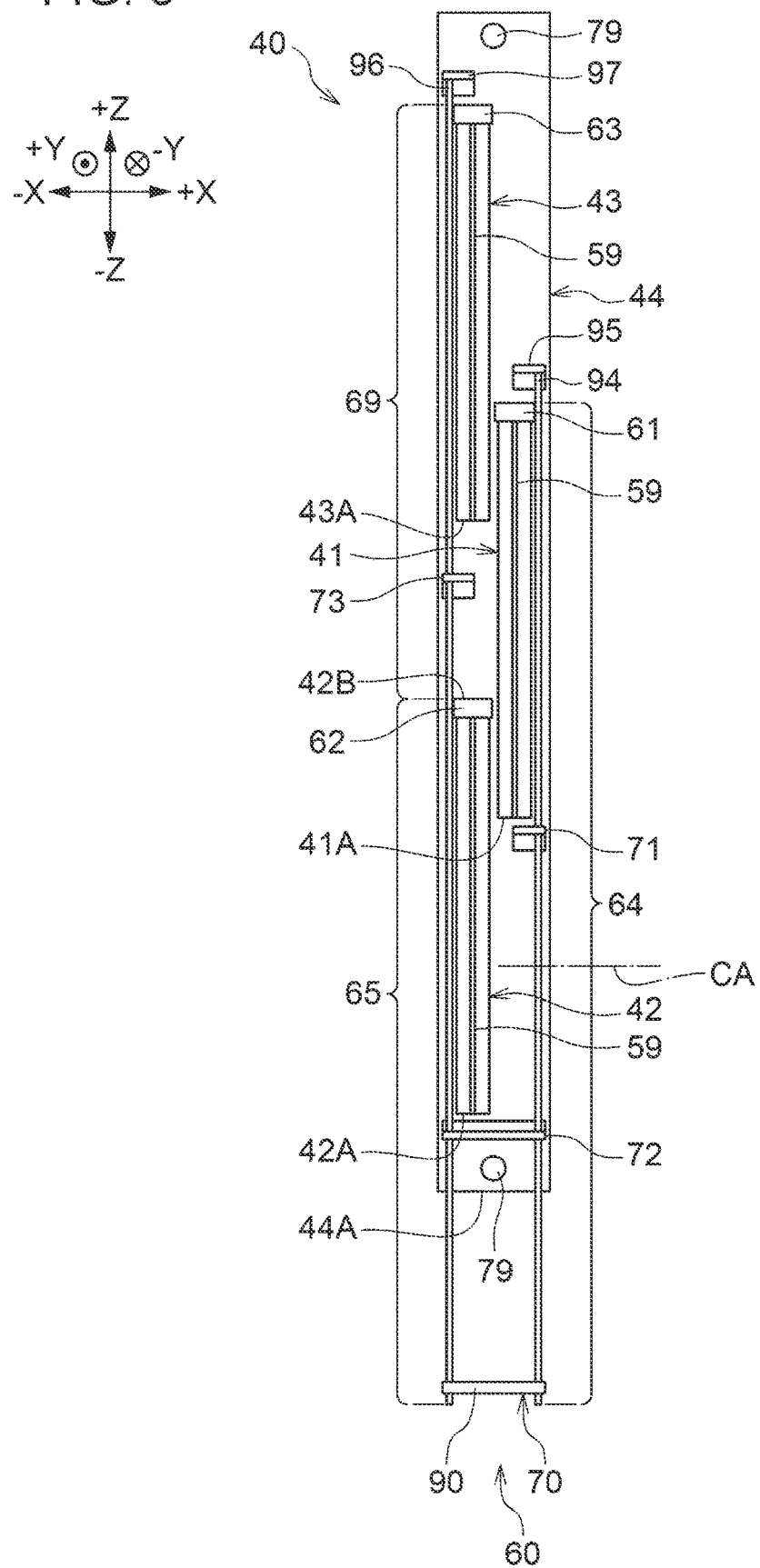
FIG. 3 is a plan view of the exposure device according to the first exemplary embodiment.
Figure 4:
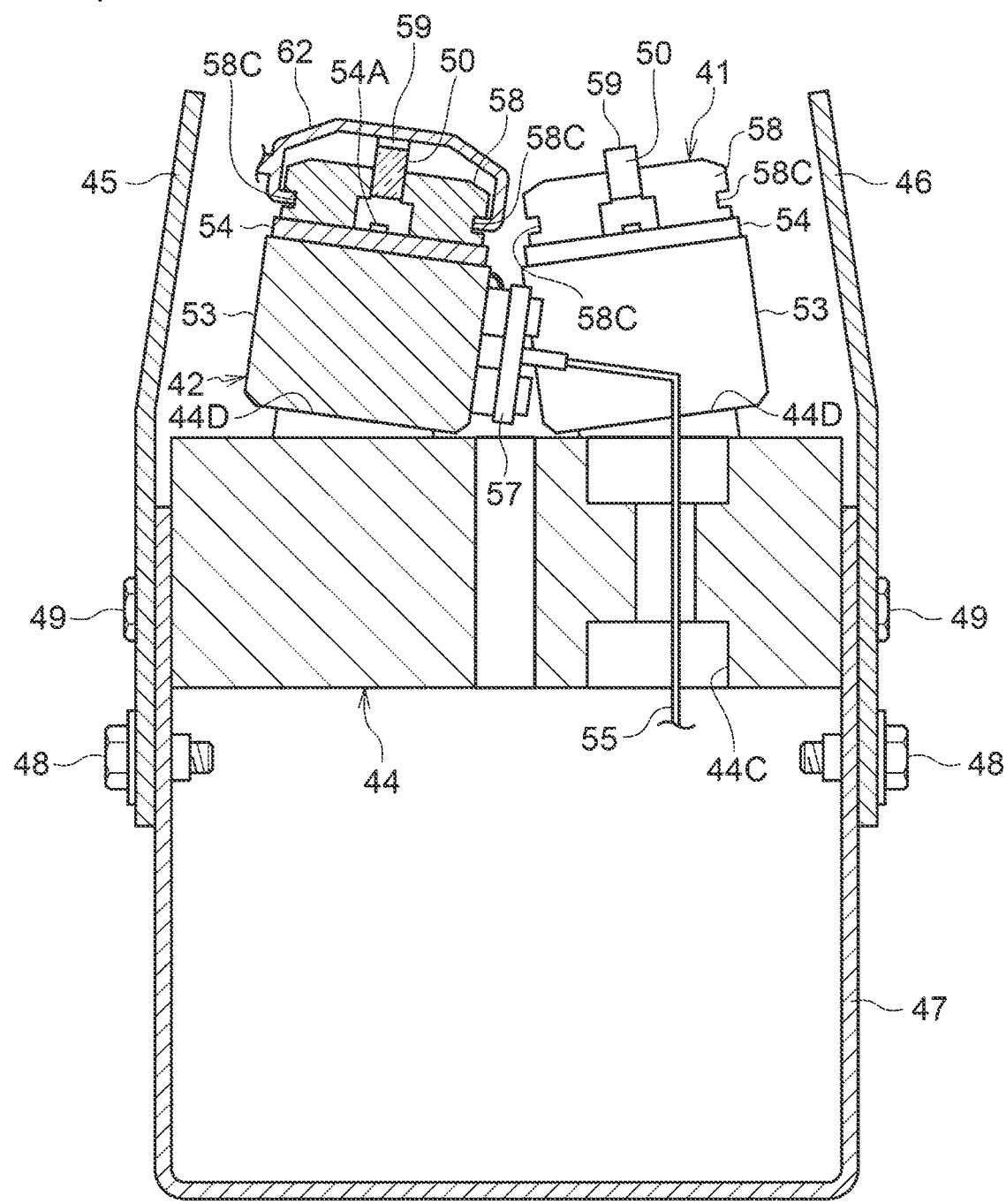
FIG. 4 is a cross-sectional view of the exposure device according to the first exemplary embodiment (sectional view taken along line IV-IV in FIG. 2)

The structure of the exposure device 40 according to the present exemplary embodiment will now be described. The exposure device 40 is an example of a light-emitting device. FIG. 2 is a perspective view illustrating the structure of the exposure device 40. FIG. 3 is a plan view illustrating the structure of the exposure device 40. FIG. 4 is a cross-sectional view illustrating the structure of the exposure device 40 (sectional view taken along line IV-IV in FIG. 2). In FIG. 2, a portion of a cleaning mechanism 60 described below is not illustrated. In FIG. 3, side coverings 45 and 46 and a container covering 47 described below are not illustrated. In FIG. 4, a portion of the cleaning mechanism 60 described below and a portion of a wire 55 are not illustrated.

The Z direction in the drawings corresponds to a depth direction of the exposure device 40, and is also a longitudinal direction of the exposure device 40 as described below. The Z direction in the drawings is also an axial direction of the corresponding photoconductor drum 32 (see FIG. 1). The X direction in the drawings corresponds to a width direction of the exposure device 40, and is also a transverse direction of the exposure device 40. The Y direction in the drawings corresponds to a height direction of the exposure device 40. As described below, the +Y direction in the drawings is a light-emitting direction in which the exposure device 40 emits light. In other words, the +Y direction in the drawings is a radiation direction in which the exposure device 40 radiates light. The depth direction, the width direction, and the height direction described above are defined to facilitate description, and therefore do not limit the structure of the exposure device 40.

Referring to FIGS. 2 and 3, the exposure device 40 extends in the axial direction of the corresponding photoconductor drum 32 (see FIG. 1), which is the Z direction, and has a length in the axial direction. In other words, the exposure device 40 has an elongated shape that extends in the Z direction. The length of the exposure device 40 in the longitudinal direction (Z direction) is greater than or equal to the length of the photoconductor drum 32 in the axial direction (Z direction).

The exposure device 40 emits light in the +Y direction (hereinafter sometimes referred to as "light-emitting direction") so that the corresponding photoconductor drum 32 (see FIG. 1) is exposed to light as described above. In FIGS. 2 and 4, for example, the exposure device 40 is oriented such that the light-emitting direction is upward. However, in practice, as illustrated in FIG. 1, the exposure device 40 emits light downward in the direction of gravity. The relationship between the light-emitting direction of the exposure device 40 and the direction of gravity is not limited, and the light-emitting direction of the exposure device 40 may be changed as appropriate. For example, the light-emitting direction of the exposure device 40 may instead be, for example, an upward direction opposite to the direction of gravity, a horizontal direction, or a direction at an angle with respect to the direction of gravity.

As illustrated in FIG. 2, the exposure device 40 includes light-emitting units 41, 42, and 43, a base 44, positioning parts 79, the side coverings 45 and 46, the container covering 47, and the cleaning mechanism 60.

Light-Emitting Units 41, 42, and 43

The light-emitting unit 41 is an example of a first light-emitting unit. The light-emitting unit 42 is an example of a second light-emitting unit. As illustrated in FIGS. 2, 3, and 4, the light-emitting units 41, 42, and 43 are provided on the base 44. More specifically, the light-emitting units 41, 42, and 43 are disposed on a surface of the base 44 facing in the +Y direction.

Each of the light-emitting units 41, 42, and 43 extends in the −Z direction, which is an example of one direction. In other words, the light-emitting units 41, 42, and 43 are elongated members having elongated shapes that extend in the Z direction. Each of the light-emitting units 41, 42, and 43 emits light through an emission surface 59. More specifically, each of the light-emitting units 41, 42, and 43 emits light in the light-emitting direction (+Y direction). The emission direction (+Y direction) is a direction in which the emission direction and the extension direction of the light-emitting unit (Z direction) cross each other.

In the present exemplary embodiment, as illustrated in FIG. 3, the light-emitting units 41, 42, and 43 are arranged in a staggered pattern in plan view (that is, when viewed in the −Y direction). More specifically, the light-emitting units 43 and 42 are arranged in the Z direction with an interval therebetween, and the light-emitting unit 41 is disposed between the light-emitting units 43 and 42 in the Z direction and adjacent to the light-emitting units 43 and 42 in the +X direction.

Still more specifically, the light-emitting units 41, 42, and 43 are arranged in the following manner. The light-emitting unit 41 is located in the −Z direction with respect to the light-emitting unit 43. The light-emitting unit 41 is located in the −Z direction with respect to the light-emitting unit 43 at a position shifted from the light-emitting unit 43 in the +X direction. When viewed in the X direction, an end portion of the light-emitting unit 41 in the +Z direction overlaps an end portion of the light-emitting unit 43 in the −Z direction. Thus, when viewed in the X direction, a light emission area of the light-emitting unit 43 and a light emission area of the light-emitting unit 41 partially overlap in the Z direction. The light-emitting unit 43 and the light-emitting unit 41 do not overlap when viewed in the Z direction.

The light-emitting unit 42 is located in the −Z direction with respect to the light-emitting unit 41. The light-emitting unit 42 is located in the −Z direction with respect to the light-emitting unit 41 at a position shifted from the light-emitting unit 41 in the −X direction. When viewed in the X direction, an end portion of the light-emitting unit 42 in the +Z direction overlaps an end portion of the light-emitting unit 41 in the −Z direction. Thus, when viewed in the X direction, the light emission area of the light-emitting unit 41 and a light emission area of the light-emitting unit 42 partially overlap in the Z direction. The light-emitting unit 41 and the light-emitting unit 42 do not overlap when viewed in the Z direction. The light-emitting unit 43 and the light-emitting unit 42 overlap when viewed in the Z direction.

Figure 5:
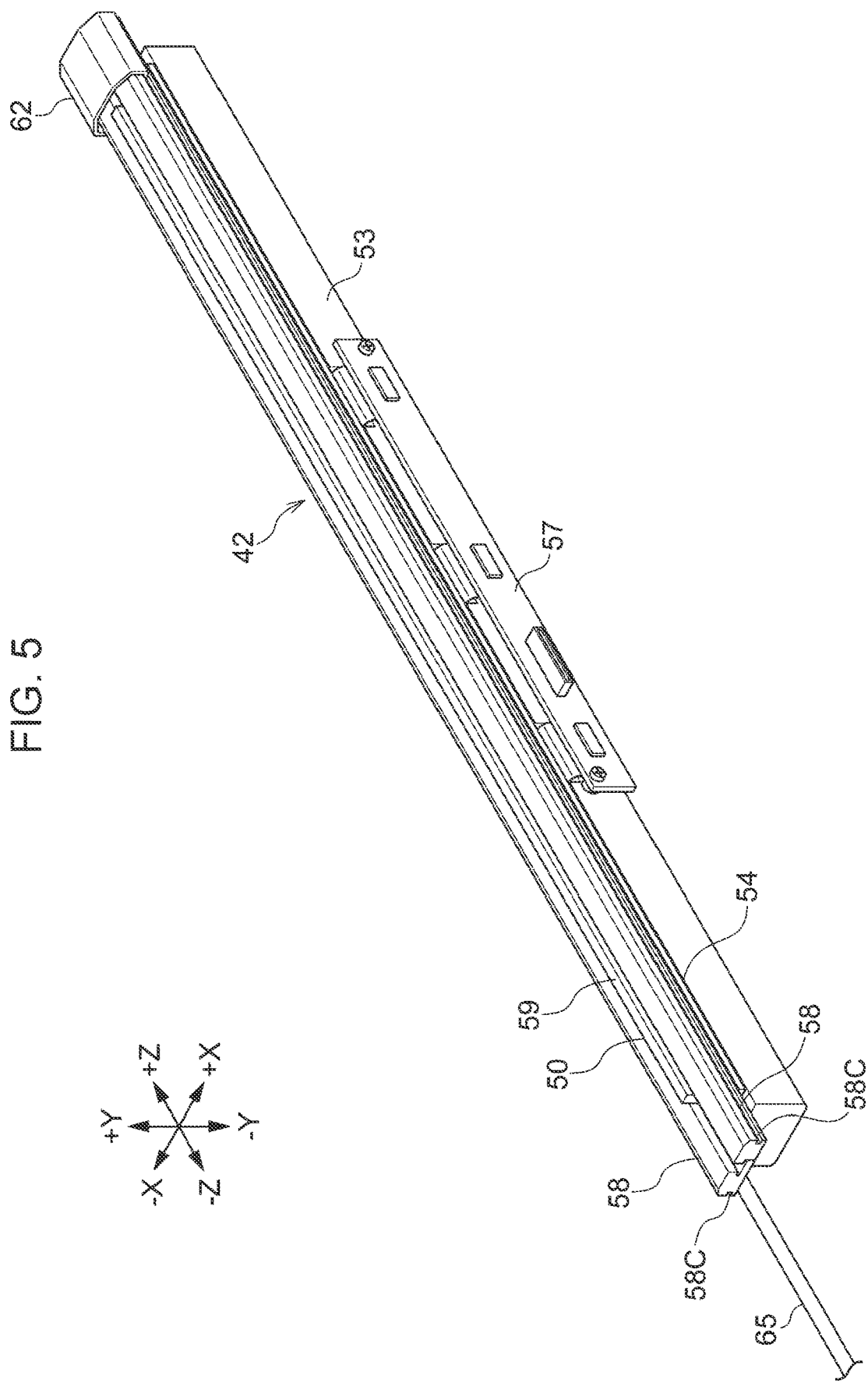
FIG. 5 is a perspective view of a light-emitting unit included in the exposure device according to the first exemplary embodiment.

As illustrated in FIGS. 4 and 5, each of the light-emitting units 41, 42, and 43 includes a body 53, a light-emitting board 54, which is as an example of a light-emitting member, a driving board 57, a lens unit 50, and a lens holder 58. FIG. 5 illustrates the light-emitting unit 42 as a representative example of the light-emitting units 41, 42, and 43. The structure of the light-emitting unit 43 is similar to that of the light-emitting unit 42. The structure of the light-emitting unit 41 is obtained by inverting the structure of the light-emitting unit 42 in the left-right direction (X direction).

Referring to FIG. 4, the light-emitting board 54 has a function of emitting light in the light-emitting direction (+Y direction) and includes a substrate and plural light sources 54A arranged in the Z direction on the substrate. In the present exemplary embodiment, each light source 54A includes, for example, plural light-emitting elements. For example, each light source 54A is a light-emitting-element array including a semiconductor substrate and plural light-emitting elements arranged in the Z direction on the semiconductor substrate. In the present exemplary embodiment, the light sources 54A, which are the light-emitting-element arrays, are arranged in a staggered pattern along the Z direction on the substrate of the light-emitting board 54. Each light source 54A may be a single light-emitting element instead of the light-emitting-element array. The light-emitting elements may each be composed of, for example, a light-emitting diode, a light-emitting thyristor, or a laser element. When the light-emitting elements are arranged along the Z direction, a resolution of, for example, 2400 dpi is obtained.

As illustrated in FIG. 4, the body 53 has a function of a support that supports the light-emitting board 54 at a side of the light-emitting board 54 in a direction opposite to the light-emitting direction (−Y direction). In other words, the body 53 supports the light-emitting board 54 at a back surface (surface facing in the −Y direction) of the light-emitting board 54. As illustrated in FIG. 5, the body 53 has the shape of a rectangular parallelepiped that extends in the Z direction. More specifically, similarly to the base 44, the body 53 is composed of a metal block made of, for example, iron, steel, or stainless steel. The body 53 may instead be composed of a metal block made of a metal other than iron, steel, or stainless steel. For example, the metal block may be made of aluminum, which has a higher thermal conductivity and a lower weight than iron, steel, or stainless steel. However, when the base 44 and the body 53 have different coefficients of thermal expansion, distortion or bending may occur. Therefore, to reduce distortion and bending, the base 44 and the body 53 may be made of the same material.

The driving board 57 is attached to a side surface of the body 53. The driving board 57 is used to drive the light-emitting board 54. The driving board 57 may be, for example, an application specific integrated circuit (ASIC) board. In each of the light-emitting units 42 and 43, the driving board 57 is attached to a side surface of the body 53 facing in the +X direction. In the light-emitting unit 41, the driving board 57 is attached to a side surface of the body 53 facing in the −X direction.

The lens unit 50 and the lens holder 58 are located in the light-emitting direction (+Y direction) with respect to the light-emitting board 54. Similarly to the body 53, the lens unit 50 and the lens holder 58 extend in the Z direction.

The lens unit 50 is composed of, for example, a lens array including plural lenses. The lens unit 50 is located in the light-emitting direction with respect to the light sources 54A and faces each light source 54A with a gap therebetween. The lens unit 50 has the emission surface 59 through which light is emitted. The emission surface 59 extends along the −Z direction. More specifically, the emission surface 59 is a surface of the lens unit 50 facing in the +Y direction, and faces the corresponding photoconductor drum 32 (see FIG. 1). The light from the light sources 54A is incident on the lens unit 50, and is emitted through the emission surface 59 toward a surface (that is, an outer peripheral surface) of the corresponding photoconductor drum 32 (see FIG. 1), which is an irradiation target.

The lens holder 58 has a function of holding the lens unit 50. More specifically, the lens holder 58 clamps the lens unit 50 in the X direction such that the lens unit 50 projects from the lens holder 58 in the light-emitting direction. The lens holder 58 has fitting grooves 58C, to which fitting portions 84C described below are fitted, in side surfaces thereof facing in the −X and +X directions. The fitting grooves 58C extend in the Z direction. More specifically, the fitting grooves 58C extend through the lens holder 58 in the Z direction. In other words, the fitting grooves 58C open in the −Z and +Z directions.

Although the body 53 is composed of a metal block in the present exemplary embodiment, the body 53 is not limited to this. For example, the body 53 may instead be composed of a metal plate. Also, the body 53 may instead be made of a resin material.

Base 44

As illustrated in FIGS. 2 and 3, similarly to the light-emitting units 41, 42, and 43, the base 44 extends in the −Z direction. In other words, the base 44 is an elongated member having an elongated shape that extends in the Z direction. More specifically, the base 44 is rectangular-parallelepiped-shaped.

The base 44 is located in a direction opposite to the light-emitting direction with respect to the light-emitting units 41, 42, and 43. More specifically, the bodies 53 of the light-emitting units 41, 42, and 43 are attached to the base 44 at the sides of the bodies 53 in the direction opposite to the light-emitting direction. In other words, the base 44 supports the light-emitting units 41, 42, and 43.

In the present exemplary embodiment, the base 44 is composed of a metal block. According to the present exemplary embodiment, the metal block does not include a general metal plate that is shaped by bending, but is a metal body having a thickness that does not substantially allow bending when shaped to serve as the base of the exposure device 40. In one example, the metal body has a thickness (dimension in the Y direction) that is 10% or more of the width (dimension in the X direction) of the base 44. Furthermore, the metal body may be shaped so that the thickness of the base 44 is 20% or more and 100% or less of the width of the base 44.

A wide image forming apparatus according to the related art is used to output a monochrome image, and the required image quality is lower than that of a full-color printer for commercial printing. The image forming apparatus 10 according to the present exemplary embodiment is a full-color printer for commercial printing, and is required to form a high-quality image. Accordingly, a metal block that is more rigid than a metal plate is used to reduce the influence of bending of the base 44 on the image quality.

The base 44 may be made of, for example, iron, steel, or stainless steel. The base 44 may instead be composed of a metal block made of a material other than iron, steel, or stainless steel. For example, aluminum, which has a higher thermal conductivity and a lower weight than iron, steel, or stainless steel, may instead be used. In the present exemplary embodiment, heat generated by the light sources 54A is dissipated through the body 53. Therefore, rigidity is prioritized over thermal conductivity and weight, and the base 44 is made of iron, steel, or stainless steel.

The thickness of the base 44 in the light-emitting direction (+Y direction) may be greater than the thickness of the body 53 of each of the light-emitting units 41, 42, and 43 in the light-emitting direction (+Y direction). In such a case, the rigidity of the base 44 (flexural rigidity in the Y direction) is greater than the rigidity of each of the light-emitting units 41, 42, and 43. The thickness of the base 44 in the light-emitting direction (+Y direction) may be 5 mm or more, 10 mm or more, or 20 mm or more.

As illustrated in FIG. 4, surfaces of portions of the base 44 that support the light-emitting units 41, 42, and 43 are inclined surfaces 44D. The inclined surfaces 44D are inclined downward toward the center of the base 44 from the ends of the base 44 in the X direction. More specifically, the inclined surface 44D that supports the light-emitting unit 41 is inclined downward in the −X direction. The inclined surfaces 44D that support the light-emitting units 42 and 43 are inclined downward in the +X direction. Thus, when viewed in the Z direction, the light-emitting unit 41 and each of the light-emitting units 42 and 43 are inclined so as to be a down slope toward inside of the width direction opposite each other. The inside of the width direction represents the inside of the width direction in whole of the exposure device or whole of the light-emitting device.

Although the base 44 is composed of a metal block in the present exemplary embodiment, the base 44 is not limited to this. For example, the base 44 may instead be composed of a metal plate. Also, the base 44 may instead be made of a resin material.

Positioning Parts 79

The positioning parts 79 illustrated in FIGS. 2 and 3 have a function of positioning the light-emitting units 41, 42, and 43 with respect to the corresponding photoconductor drum 32 (see FIG. 1), which is an example of an irradiation target, by coming onto contact with an outer peripheral surface of the photoconductor drum 32 or outer peripheral surfaces of members provided on the photoconductor drum 32. More specifically, the positioning parts 79 come into contact with bearing members provided at both ends of the photoconductor drum 32 in the axial direction. In the present exemplary embodiment, the positioning parts 79 are provided on a surface of the base 44 facing in the +Y direction at one and the other ends of the base 44 in the Z direction. Still more specifically, the positioning parts 79 are positioned to overlap the light-emitting units 41, 42, and 43 when viewed in the Z direction. In other words, the positioning parts 79 are disposed in a region extending from an end of the light-emitting unit 42 in the −X direction to an end of the light-emitting unit 41 in the +X direction.

The positioning parts 79 are composed of solid cylindrical shafts that extend in the +Y direction from the surface of the base 44 facing in the +Y direction. Distal ends (ends in the +Y direction) of the positioning parts 79 are located further in the +Y direction than the ends of the side coverings 45 and 46 in the +Y direction. In the present exemplary embodiment, the distal ends of the positioning parts 79 are in contact with the outer peripheral surface of the photoconductor drum 32 at the ends of the photoconductor drum 32 in the axial direction (more specifically, at positions outside the region in which a toner image is formed). Thus, the light-emitting units 41, 42, and 43 are positioned at a predetermined distance from the photoconductor drum 32.

Container Covering 47

As illustrated in FIGS. 2 and 4, the container covering 47 is a cover that contains wires 55 that are electrically connected to the light-emitting units 41, 42, and 43 (more specifically, to the driving boards 57). The container covering 47 is attached to a portion of the base 44 in the −Y direction. In the present exemplary embodiment, the container covering 47 is U-shaped in cross section and opens in the +Y direction. End portions of the container covering 47 in the +Y direction are fastened to surfaces of the base 44 at both sides (sides in the −X and +X directions) of the base 44 with plural fastening members 49. The fastening members 49 have helical grooves that enable the fastening members 49 to be fastened. In other words, the fastening members 49 are members having a screw mechanism, and may be, for example, screws or bolts. As illustrated in FIG. 4, each wire 55 extends through a passage 44C, which extends through the base 44 in the Y direction, to the outside of the base 44 in the −Y direction.

Side Coverings 45 and 46

The side coverings 45 and 46 illustrated in FIGS. 2 and 4 are examples of a removably attachable member. The side coverings 45 and 46 are coverings that cover the light-emitting units 41, 42, and 43 from the sides thereof. The side coverings 45 and 46 are plate-shaped and extend from the base 44 in the light-emitting direction.

The side coverings 45 and 46 are removably attached to the base 44 at one side (side in the −X direction) and the other side (side in the +X direction), respectively, of the base 44 in the width direction. More specifically, portions of the side coverings 45 and 46 in the −Y direction are removably attached to both sides of the base 44 in the transverse direction (X direction). Still more specifically, the side coverings 45 and 46 are removably fastened with fastening members 48. The fastening members 48 have helical grooves that enable the fastening members 48 to be fastened. In other words, the fastening members 48 are members having a screw mechanism, and may be, for example, screws or bolts.

Cleaning Mechanism 60

Referring to FIG. 3, the cleaning mechanism 60 cleans the emission surfaces 59 (see also FIGS. 4 and 5) of the light-emitting units 41, 42, and 43. The emission surface 59 of the light-emitting unit 41 is an example of a first emission surface. The emission surface 59 of the light-emitting unit 42 is an example of a second emission surface. The emission surface 59 of the light-emitting unit 43 is an example of a third emission surface.

As illustrated in FIG. 3, the cleaning mechanism 60 includes cleaning units 61, 62, and 63, a transmission unit 70, and support parts 71, 72, and 73.

Cleaning Units 61, 62, and 63

The cleaning unit 61 illustrated in FIG. 3 is an example of a first cleaning unit. The cleaning unit 62 illustrated in FIG. 3 is an example of a second cleaning unit. The cleaning unit 63 illustrated in FIG. 3 is an example of a third cleaning unit. The cleaning units 61, 62, and 63 are members that clean the emission surfaces 59 of the light-emitting units 41, 42, and 43, respectively. As illustrated in FIG. 3, the cleaning units 61, 62, and 63 are respectively provided on the light-emitting units 41, 42, and 43. The cleaning unit 61 and each of the cleaning units 62 and 63 have similar structures except that the structures thereof are inverted with respect to each other in the left-right direction (X direction). Therefore, in the following description, the structure of the cleaning unit 61 will be described, and description of the structure of the cleaning units 62 and 63 will be omitted as appropriate.

The cleaning unit 61 is capable of moving in the −Z and +Z directions (hereinafter referred to as "−+Z directions") to clean the corresponding emission surface 59. The +Z direction is an example of an opposite direction. FIG. 3 illustrates the cleaning units 61, 62, and 63 that are positioned furthest in the +Z direction.

Figure 6:
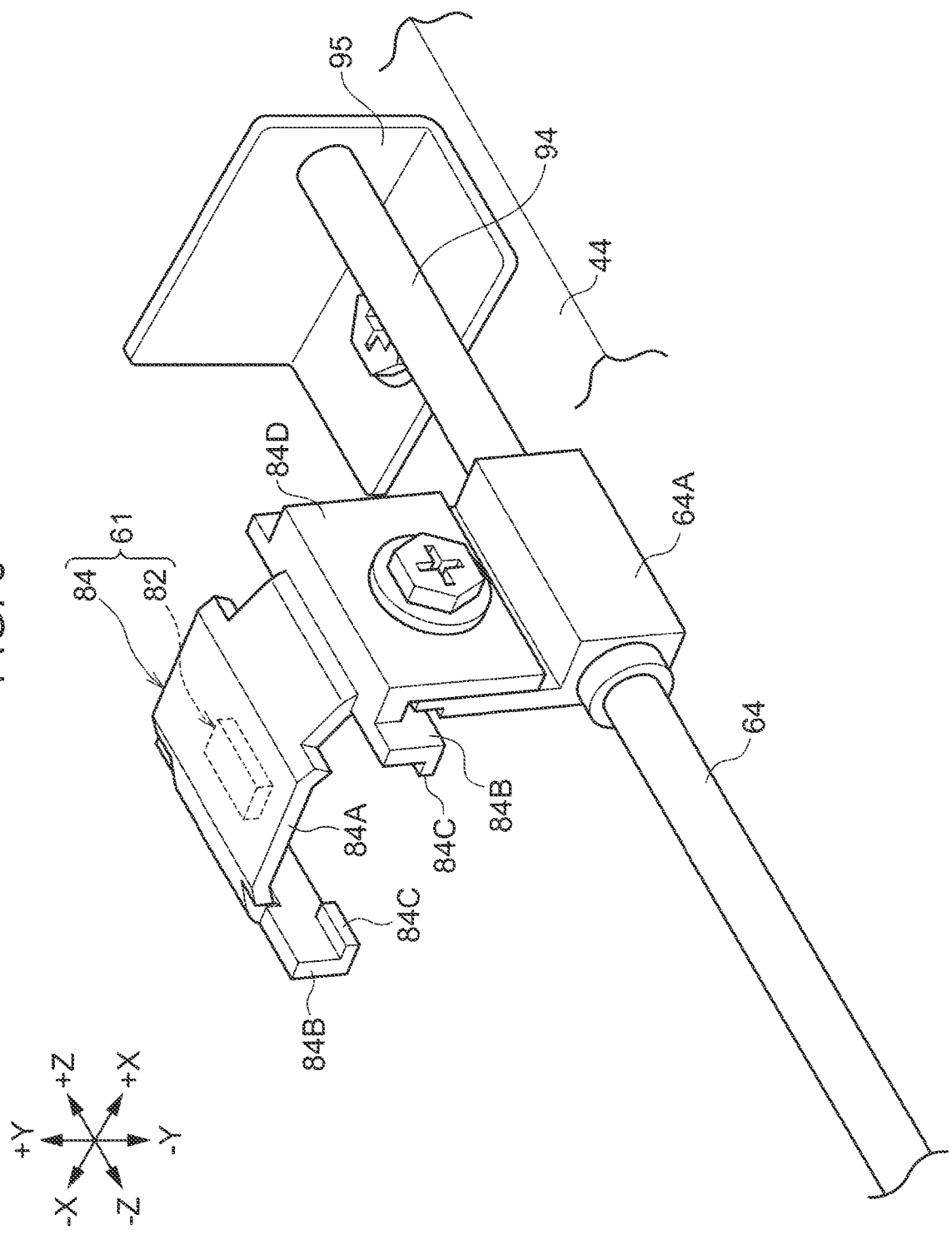
FIG. 6 is a perspective view of a cleaning unit included in the exposure device according to the first exemplary embodiment.
Figure 7:
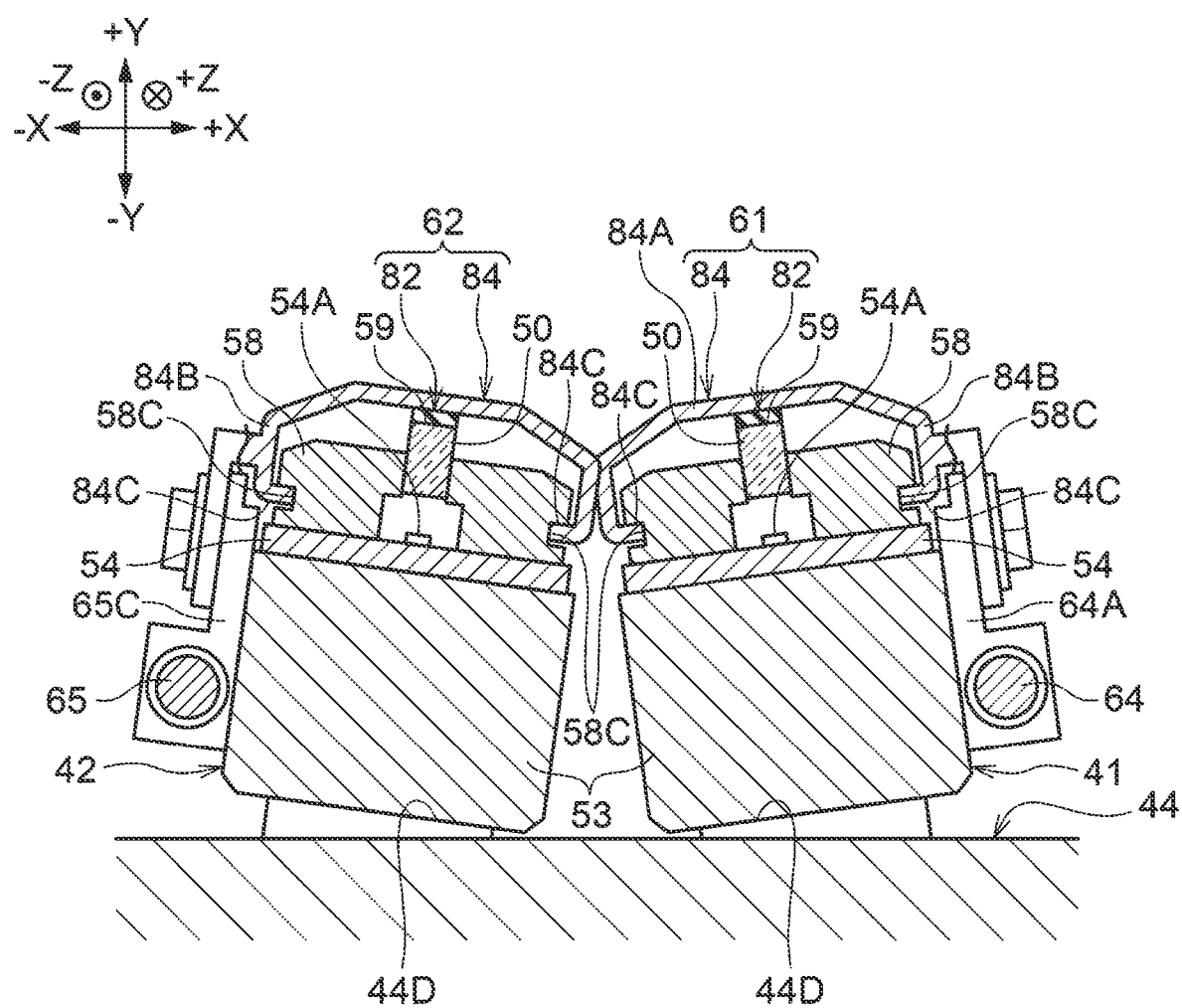
FIG. 7 is a cross-sectional view of cleaning units included in the exposure device according to the first exemplary embodiment.

More specifically, as illustrated in FIGS. 6 and 7, the cleaning unit 61 includes a contact part 82 and a support part 84. The contact part 82 comes into contact with the emission surface 59. In other words, the contact part 82 cleans the emission surface 59 by moving in the −+Z directions. More specifically, the contact part 82 moves in the −+Z directions to clean the emission surface 59 by wiping the emission surface 59.

The contact part 82 is made of, for example, an elastic material, such as urethane rubber. The contact part 82 is plate-shaped. The material and shape of the contact part 82 may be known material and shape. The contact part 82 is attached to an opposing portion 84A of the support part 84 described below.

The support part 84 supports the contact part 82. More specifically, the support part 84 includes the opposing portion 84A, a pair of side portions 84B, and a pair of fitting portions 84C.

The opposing portion 84A is located in the light-emitting direction (+Y direction) with respect to the emission surface 59. More specifically, the opposing portion 84A opposes the emission surface 59 with a gap therebetween. The opposing portion 84A is plate-shaped and has a thickness substantially in the Y direction.

The pair of side portions 84B extend diagonally downward from the opposing portion 84A in FIG. 7, and then extend in the −Y direction to positions on the sides of the lens holder 58 in the −X and +X directions.

The pair of fitting portions 84C project toward the lens holder 58 from the side portions 84B, and are fitted to the fitting grooves 58C. The fitting portions 84C are guided along the fitting grooves 58C so that the cleaning unit 61 is movable in the −+Z directions.

Transmission Unit 70

The transmission unit 70 illustrated in FIG. 3 extends from the cleaning units 61, 62, and 63 in the −Z direction, and has a function of transmitting a moving force for moving the cleaning units 61, 62, and 63 to the cleaning units 61, 62, and 63. More specifically, the transmission unit 70 includes extending parts 64 and 65, a coupling part 69, and a connecting part 90.

The extending part 64 is an example of a first extending part. The extending part 65 is an example of an extending part or a second extending part. As illustrated in FIG. 3, the extending parts 64 and 65 extend from the cleaning units 61 and 62, respectively and extend in the −Z direction. The coupling part 69 extends from the cleaning unit 63 in the −Z direction and is coupled to the cleaning unit 62. Thus, the moving force of the extending part 65 is transmitted to the cleaning unit 63 through the coupling part 69.

The extending parts 64 and 65 and the coupling part 69 are composed of solid cylindrical rods that extend from the cleaning units 61, 62, and 63 in the −Z direction. More specifically, the extending part 65 and the coupling part 69 are composed of solid cylindrical rods that are integrated together. The shape of the rods is not limited to a solid cylindrical shape, and may instead be, for example, a hollow cylindrical shape, a prism shape, or a rectangular tubular shape. The cross-sectional shape of the rods is not limited to a circular shape, and may instead be, for example, a polygonal shape or other shapes. The extending part 65 and the coupling part 69 may be composed of separate parts.

As illustrated in FIGS. 6 and 7, the extending part 64 is located in the +X direction and in the −Y direction with respect to the cleaning unit 61. More specifically, the extending part 64 extends in the −Z direction at a position on the outer side of the light-emitting unit 41 (more specifically, the body 53) in the width direction. Still more specifically, the extending part 64 is located in the +X direction with respect to the light-emitting unit 41 (more specifically, the body 53). One end (more specifically, end in the +Z direction) of the extending part 64 is attached to one of the side portions 84B of the support part 84 of the cleaning unit 61 with an attachment part 64A. The outside of the width direction represents the outside of the width direction in whole of the exposure device or whole of the light-emitting device.

As described above, the extending part 64 is located in the +X direction with respect to the cleaning unit 61. Referring to FIG. 7, the extending part 65 and the coupling part 69 are located in the −X direction with respect to the cleaning units 62 and 63, respectively. Except for this point and the length of the extending part and the coupling part, the structures of the extending part 65 and the coupling part 69 are similar to that of the extending part 64. In other words, the extending part 65 and the coupling part 69 are located in the −X direction and the −Y direction with respect to the cleaning units 62 and 63, respectively. More specifically, each of the extending part 65 and the coupling part 69 extends in the −Z direction at a position on the outer side of the corresponding one of the light-emitting units 42 and 43 (more specifically, the body 53) in the width direction. Still more specifically, each of the extending part 65 and the coupling part 69 is located in the −X direction with respect to the corresponding one of the light-emitting units 42 and 43 (more specifically, the body 53). One end (more specifically, end in the +Z direction) of each of the extending part 65 and the coupling part 69 is attached to one of the side portions 84B of the support part 84 of the corresponding one of the cleaning units 62 and 63 with an attachment part 65C. Thus, in the present exemplary embodiment, the extending part 65 and the coupling part 69 are disposed at a position shifted from the extending part 64 in the X direction (width direction). The structure of the cleaning unit 63 and the attachment structure between the cleaning unit 63 and the coupling part 69 are similar to the structure of the cleaning unit 62 and the attachment structure between the cleaning unit 62 and the extending part 65. Therefore, in FIG. 7, only the structure of the cleaning unit 62 and the attachment structure between the cleaning unit 62 and the extending part 65 are illustrated.

As illustrated in FIGS. 2 and 3, the extending parts 64 and 65 extend in the −Z direction at positions shifted from the positioning parts 79 in the X direction. More specifically, the extending part 64 is located in the +X direction with respect to the positioning parts 79. The extending part 65 is located in the −X direction with respect to the positioning parts 79. Thus, the positioning parts 79 are disposed between the extending parts 64 and 65 in the X direction.

When the cleaning units 62 and 63 are positioned furthest in the +Z direction, an end of the extending part 65 in the −Z direction is located further in the −Z direction than one end 41A (end in the −Z direction) of the light-emitting unit 41. More specifically, when the cleaning units 62 and 63 are positioned furthest in the +Z direction, the end of the extending part 65 in the −Z direction is located further in the −Z direction than one end 42A (end in the −Z direction) of the light-emitting unit 42. Still more specifically, when the cleaning units 62 and 63 are positioned furthest in the +Z direction, the end of the extending part 65 in the −Z direction is located further in the −Z direction than one end 44A (end in the −Z direction) of the base 44.

When the cleaning unit 61 is positioned furthest in the +Z direction, an end of the extending part 64 in the −Z direction is located further in the −Z direction than a midpoint CA between the one end 41A (end in the −Z direction) of the light-emitting unit 41 and the one end 42A (end in the −Z direction) of the light-emitting unit 42.

More specifically, when the cleaning unit 61 is positioned furthest in the +Z direction, the end of the extending part 64 in the −Z direction is located further in the −Z direction than the one end 42A (end in the −Z direction) of the light-emitting unit 42. Still more specifically, when the cleaning unit 61 is positioned furthest in the +Z direction, the end of the extending part 64 in the −Z direction is located further in the −Z direction than the one end 44A (end in the −Z direction) of the base 44.

Still more specifically, when the cleaning unit 61 is positioned furthest in the +Z direction and when the cleaning unit 62 is positioned furthest in the +Z direction, the end of the extending part 64 in the −Z direction and the end of the extending part 65 in the −Z direction are at the same position in the Z direction.

The connecting part 90 connects the extending part 64 and the extending part 65 to each other. More specifically, the connecting part 90 extends in the X direction from the end of the extending part 64 in the −Z direction to the end of the extending part 65 in the −Z direction. Still more specifically, an end of the connecting part 90 in the +X direction is attached to the end of the extending part 64 in the −Z direction, and an end of the connecting part 90 in the −X direction is attached to the end of the extending part 65 in the −Z direction. In other words, the connecting part 90 connects the ends of the extending parts 64 and 65 in the −Z direction to each other.

As described above, the connecting part 90 connects the extending part 64 and the extending part 65 to each other. Accordingly, in the transmission unit 70, the cleaning unit 61 and the cleaning unit 62 are connected to each other by the connecting part 90 and the extending parts 64 and 65. Furthermore, in the transmission unit 70, the cleaning unit 61, the cleaning unit 62, and the cleaning unit 63 are connected to each other by the connecting part 90, the extending parts 64 and 65, and the coupling part 69.

The connecting part 90 is located further in the −Z direction than the one end 42A (end in the −Z direction) of the light-emitting unit 42. More specifically, the connecting part 90 is located further in the −Z direction than the support part 72. Still more specifically, the connecting part 90 is located further in the −Z direction than the one end 44A (end in the −Z direction) of the base 44.

The connecting part 90 also serves as an input unit through which an operator inputs the moving force. More specifically, the connecting part 90 also serves as a handle to be held by the operator. The operator manually operates the connecting part 90 so that the moving force is generated, and the generated moving force is transmitted to the cleaning unit 61 through the extending part 64. The moving force is also transmitted to the cleaning unit 62 through the extending part 65. In addition, the moving force is also transmitted to the cleaning unit 63 through the extending part 65 and the coupling part 69.

Thus, in the present exemplary embodiment, the connecting part 90 is provided as a common handle for the extending parts 64 and 65. Therefore, when the connecting part 90 is operated, the cleaning units 61, 62, and 63 are moved together.

Support Parts 71, 72, and 73

As illustrated in FIG. 3, the support part 71 supports the extending part 64 such that the extending part 64 is movable in the −+Z directions. The support part 73 supports the coupling part 69 such that the coupling part 69 is movable in the −+Z directions. The support part 72 supports both of the extending parts 64 and 65 such that the extending parts 64 and 65 are movable in the −+Z directions. The support parts 71, 72, and 73 are provided on the base 44 and are not fixed to the side coverings 45 and 46.

More specifically, as illustrated in FIG. 8, the support part 71 includes a bottom plate 75 and a side plate 76, and is L-shaped when viewed in the X direction. The bottom plate 75 is attached to the base 44 with a fastening member. The fastening member has a helical groove that enables the fastening member to be fastened. In other words, the fastening member is a member having a screw mechanism, and may be, for example, a screw or a bolt. The extending part 64 is supported by the side plate 76 such that the extending part 64 is movable in the −+Z directions. The side plate 76 of the support part 71 supports the extending part 64 at a position near an end thereof in the +X direction. The structure of the support part 73 is similar to that of the support part 71, and includes a bottom plate 75 and a side plate 76. The side plate 76 of the support part 73 supports the coupling part 69 at a position near an end thereof in the −X direction.

The structure of the support part 72 is also similar to that of the support part 71, and includes a bottom plate 75 and a side plate 76, as illustrated in FIG. 9. The support part 72 has an elongated shape that extends in the X direction. The side plate 76 of the support part 72 supports the extending part 64 at a position near an end thereof in the +X direction, and supports the extending part 65 at a position near an end thereof in the −X direction.

As illustrated in FIG. 3, the support part 71 is located further in the −Z direction than the one end 41A (end in the −Z direction) of the light-emitting unit 41. More specifically, the support part 71 is located between the one end 41A of the light-emitting unit 41 and the midpoint CA. The support part 71 is disposed on the base 44 at a position such that at least a portion thereof overlaps the light-emitting unit 41 when viewed in the Z direction. The support part 71 is also disposed on the base 44 at a position such that the support part 71 overlaps the light-emitting unit 42 when viewed in the X direction.

The support part 73 is located further in the −Z direction than one end 43A (end in the −Z direction) of the light-emitting unit 43. More specifically, the support part 73 is located between the one end 43A of the light-emitting unit 43 and one end 42B (end in the +Z direction) of the light-emitting unit 42. The support part 73 is disposed on the base 44 at a position such that at least a portion thereof overlaps the light-emitting units 43 and 42 when viewed in the Z direction. The support part 73 is also disposed on the base 44 at a position such that the support part 73 overlaps the light-emitting unit 41 when viewed in the X direction.

The support part 72 is located further in the −Z direction than the one end 41A (end in the −Z direction) of the light-emitting unit 41. More specifically, the support part 72 is located further in the −Z direction than the midpoint CA. Still more specifically, the support part 72 is located further in the −Z direction than the one end 42A (end in the −Z direction) of the light-emitting unit 42.

The support part 72 is disposed on the base 44 at a position such that at least a portion thereof overlaps at least one of the light-emitting unit 41 and the light-emitting unit 42 when viewed in the Z direction. More specifically, in the present exemplary embodiment, the support part 72 is disposed on the base 44 at a position such that at least a portion thereof overlaps both the light-emitting unit 41 and the light-emitting unit 42 when viewed in the Z direction. Still more specifically, the support part 72 is disposed on the base 44 to extend from a position located in the +X direction with respect to the light-emitting unit 41 to a position located in the −X direction with respect to the light-emitting unit 42.

Although the support part 72 supports both of the extending parts 64 and 65, the support part 72 is not limited to this. The support part 72 may instead be composed of two support parts that independently support respective ones of the extending parts 64 and 65.

Other Structures of Cleaning Mechanism 60

As illustrated in FIGS. 3 and 6, the cleaning mechanism 60 includes a projecting part 94 that projects from the extending part 64 in the +Z direction. The projecting part 94 is composed of a solid cylindrical rod that is integrated with the extending part 64. The projecting part 94 comes into contact with a restricting part 95 so that movement thereof in the +Z direction is restricted.

Thus, the cleaning unit 61 is positioned at the end of the light-emitting unit 41 in the +Z direction at a position such that the fitting portions 84C of the cleaning unit 61 are not separated from the fitting grooves 58C, which are formed in the light-emitting unit 41 so as to open in the +Z direction. When the cleaning unit 61 is positioned at the end of the light-emitting unit 41 in the +Z direction, the cleaning unit 61 is positioned furthest in the +Z direction. A restricted part (not shown) provided on the extending part 64 comes into contact with a restricting part (not shown) to restrict movement of the extending part 64 in the −Z direction. The restricting part may be one of the support parts 71 and 72.

As illustrated in FIG. 3, the cleaning mechanism 60 includes a projecting part 96 that projects from the coupling part 69 in the +Z direction. The projecting part 96 is composed of a solid cylindrical rod integrated with the coupling part 69 or the extending part 65, or a solid cylindrical rod that is integrated with the coupling part 69 and the extending part 65. The projecting part 96 comes into contact with a restricting part 97 so that movement thereof in the +Z direction is restricted.

Thus, the cleaning units 62 and 63 are respectively positioned at the ends of the light-emitting units 42 and 43 in the +Z direction at positions such that the fitting portions 84C of the cleaning units 62 and 63 are not separated from the fitting grooves 58C, which are formed in the light-emitting units 42 and 43 so as to open in the +Z direction. When the cleaning units 62 and 63 are positioned at the ends of the light-emitting units 42 and 43 in the +Z direction, the cleaning units 62 and 63 are positioned furthest in the +Z direction. A restricted part (not shown) provided on at least one of the coupling part 69 and the extending part 65 comes into contact with a restricting part (not shown) to restrict movement of the coupling part 69 and the extending part 65 in the −Z direction. The restricting part may be one of the support parts 72 and 73.

Supplemental Description

In the present exemplary embodiment, as described above, the image forming apparatus 10 is capable of forming an image on a recording medium P having a large medium width (that is, length in the Z direction). More specifically, as described above, the image forming apparatus 10 is capable of forming an image on a recording medium P having a medium width of, for example, a transversely fed B2-size sheet (that is, 728 mm).

To enable formation of an image on the recording medium P having a large width, in the present exemplary embodiment, the exposure device 40 includes plural light-emitting units (light-emitting units 41, 42, and 43) as described above. The light-emitting units are long in the Z direction, and are arranged in the Z direction.

An example of an existing image forming apparatus that forms an image on a recording medium P having a large width is a low-speed image forming apparatus that forms a monochrome image of, for example, a design plan. This image forming apparatus includes a single toner-image forming unit, and the number of other components is small. Therefore, the exposure device 40 is accessible in a direction other than the Z direction (that is, in the Y direction or the X direction). Therefore, a user may directly and manually clean the emission surface 59 with a cleaning member, such as cloth, by accessing the exposure device 40 in the Y direction or the X direction. Thus, no cleaning mechanism is necessary.

In contrast, in an image forming apparatus that forms a multiple-color image as in the present exemplary embodiment (in particular, in a full-color printer for commercial printing required to print a high-quality image), the number of components is greater than that in the monochrome image forming apparatus according to the related art. Therefore, the exposure device 40 is not easily accessible in the Y direction or the X direction. Accordingly, a cleaning mechanism capable of cleaning the emission surface 59 by accessing the exposure device 40 in the Z direction is required.

Operation of Present Exemplary Embodiment

The operation of the present exemplary embodiment will now be described.

As described above, in the present exemplary embodiment, as illustrated in FIG. 3, the transmission unit 70 extends from the cleaning units 61, 62, and 63 in the −Z direction and transmits a moving force for moving the cleaning units 61, 62, and 63 to the cleaning units 61, 62, and 63. More specifically, the transmission unit 70 includes the extending parts 64 and 65, the coupling part 69, and the connecting part 90.

The operator operates the connecting part 90 so that the moving force is generated, and the generated moving force is transmitted to the cleaning units 61, 62, and 63 through the extending parts 64 and 65 and the coupling part 69. The cleaning units 61, 62, and 63 receive the moving force and are moved in the −+Z directions to clean the emission surfaces 59 of the light-emitting units 41, 42, and 43.

In the present exemplary embodiments, by input of moving force to the connecting part 90, the emission surfaces 59 of the light-emitting units 41, 42, and 43 are collectively cleaned.

In the present exemplary embodiment, the connecting part 90 that connects the extending part 64 and the extending part 65 to each other serves as a handle to be held by the operator.

In addition, in the present exemplary embodiment, the connecting part 90 is located further in the −Z direction than the one end 44A (end in the −Z direction) of the base 44.

In addition, in the present exemplary embodiment, as illustrated in FIGS. 2 and 3, the extending parts 64 and 65 extend in the −Z direction at positions shifted from the positioning parts 79 in the X direction.

In the present exemplary embodiment, when viewed in the Z direction, the light-emitting unit 41 and each of the light-emitting units 42 and 43 are inclined so as to be a down slope toward inside of the width direction opposite each other. Accordingly, compared to the structure in which the light-emitting unit 41 and each of the light-emitting units 42 and 43 are disposed horizontally when viewed in the Z direction, larger spaces are provided on the outer sides of the light-emitting unit 41 and the light-emitting units 42 and 43 in the width direction. In other words, compared to the structure in which the light-emitting unit 41 and each of the light-emitting units 42 and 43 are disposed to extend horizontally when viewed in the Z direction, the space in the +X direction with respect to the light-emitting unit 41 and the space in the −X direction with respect to the light-emitting units 42 and 43 are increased. In the present exemplary embodiment, the extending parts 64 and 65 extend in the −Z direction at positions on the outer sides of the light-emitting units 41 and 42 (more specifically, the bodies 53) in the width direction.

In the present exemplary embodiment, the body 53 of each of the light-emitting units 41, 42, and 43 is composed of a metal block made of, for example, iron, steel, or stainless steel. In the present exemplary embodiment, the base 44 is composed of a metal block made of, for example, iron, steel, or stainless steel.

Supplemental Description Regarding Exposure Device 40

In the above-described exemplary embodiment, the light-emitting unit 41 is described as an example of a first light-emitting unit, the cleaning unit 61 as an example of a first cleaning unit, and the extending part 64 as an example of a first extending part. However, the exposure device 40 is not limited to this.

For example, the light-emitting unit 43 may be regarded as an example of a first light-emitting unit, the cleaning unit 63 as an example of a first cleaning unit, and a section composed of the coupling part 69 and the extending part 65 as an example of a first extending part. In this case, the light-emitting unit 41 may be regarded as an example of a second light-emitting unit, the cleaning unit 61 as an example of a second cleaning unit, and the extending part 64 as an example of a second extending part.

In addition, for example, the light-emitting unit 43 may be regarded as an example of a first light-emitting unit, the cleaning unit 63 as an example of a first cleaning unit, and the coupling part 69 as an example of a coupling part. In this case, the light-emitting unit 42 may be regarded as an example of a second light-emitting unit, the cleaning unit 62 as an example of a second cleaning unit, and the extending part 65 as an example of an extending part.

Modifications

Figure 10:
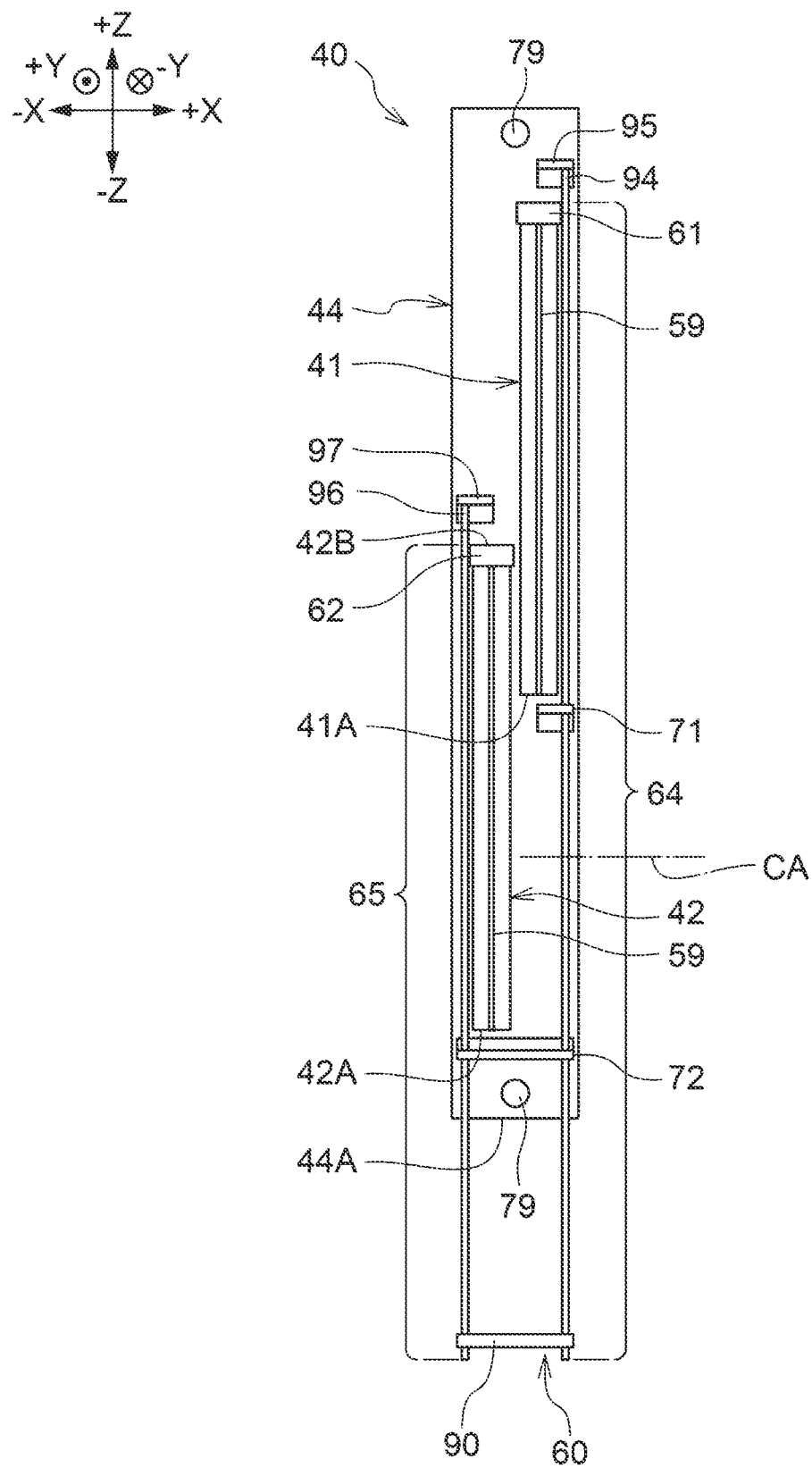
FIG. 10 is a plan view of an exposure device according to a modification including two light-emitting units.

In the present exemplary embodiment, although the light-emitting units 41, 42, and 43 are disposed on the base 44, the arrangement is not limited to this. For example, as illustrated in FIG. 10, only the light-emitting units 41 and 42 may be disposed on the base 44. In this case, the cleaning unit 63, the coupling part 69, and the support part 73 may be omitted. The length of the base 44 in the Z direction may be a length corresponding to the lengths of the two light-emitting units 41 and 42 in the Z direction. The projecting part 96 is provided on the extending part 65.

Alternatively, for example, only the light-emitting units 41 and 43 may be disposed on the base 44. In such a case, the cleaning unit 62 may be omitted. The length of the base 44 in the Z direction may be a length corresponding to the lengths of the two light-emitting units 41 and 43. Also, a light-emitting unit other than the light-emitting units 41, 42, and 43 may be additionally provided on the base 44.

Figure 11:
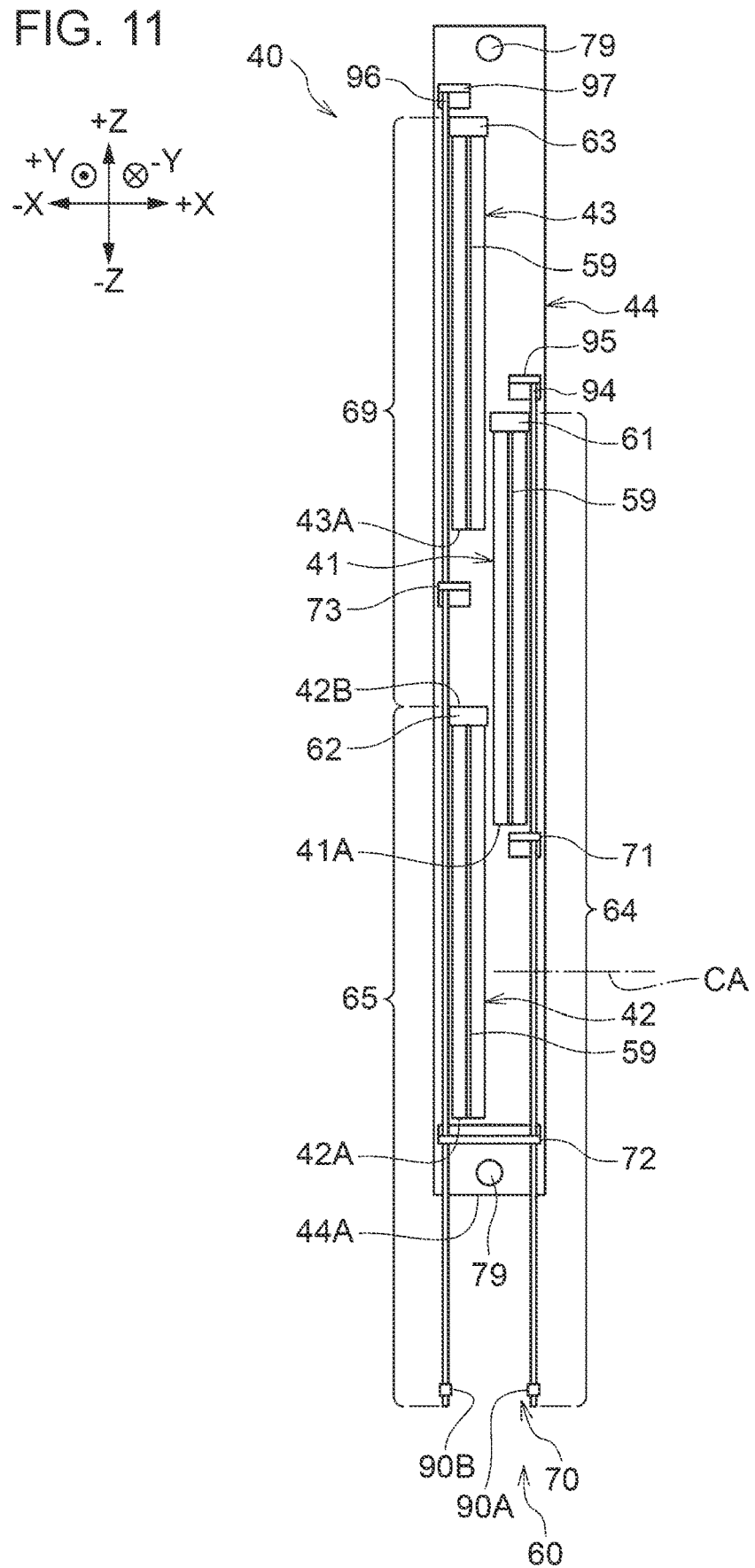
FIG. 11 is a plan view of an exposure device according to a modification in which each extending part has a handle.

In the present exemplary embodiment, the exposure device 40 includes the connecting part 90 that connects the extending part 64 and the extending part 65 to each other. However, the exposure device 40 is not limited to this. For example, as illustrated in FIG. 11, the exposure device 40 may include handles 90A and 90B provided on the extending parts 64 and 65, respectively, instead of the connecting part 90. In this structure, the handles 90A and 90B are independently operated to move the cleaning unit 61 and the pair of cleaning units 62 and 63 independently of each other. In the structure illustrated in FIG. 11, the light-emitting unit 43 is regarded as an example of a first light-emitting unit, the cleaning unit 63 as an example of a first cleaning unit, and the coupling part 69 as an example of a coupling part. In addition, the light-emitting unit 42 is regarded as an example of a second light-emitting unit, the cleaning unit 62 as an example of a second cleaning unit, and the extending part 65 as an example of an extending part.

Figure 12:
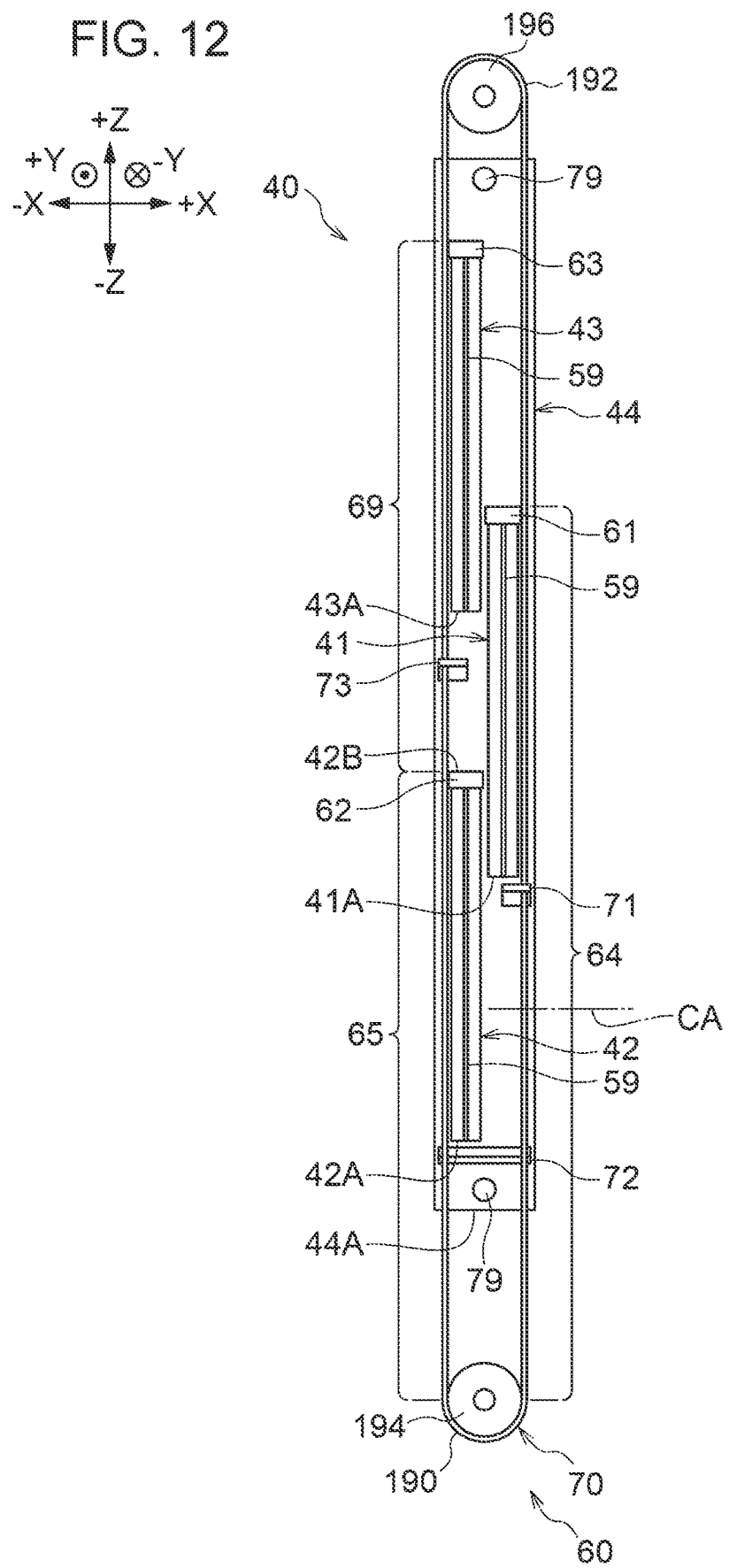
FIG. 12 is a plan view of an exposure device according to a modification in which cleaning units are moved by a driving mechanism.

In the present exemplary embodiment, the operator manually operates the connecting part 90 to generate a moving force for moving the cleaning units 61, 62, and 63. However, the cleaning units 61, 62, and 63 are not limited to this. For example, as illustrated in FIG. 12, the cleaning units 61, 62, and 63 may be moved by a driving mechanism. The structure illustrated in FIG. 12 includes a connecting part 190 that connects the ends of the extending parts 64 and 65 in the −Z direction and a connecting part 192 that connects the ends of the extending part 64 and the coupling part 69 in the −Z direction. The extending parts 64 and 65, the coupling part 69, and the connecting parts 190 and 192 are integrated together in the form of a loop-shaped wire. The wire is wrapped around a pulley 194 located in the −Z direction with respect to the end of the base 44 in the −Z direction and a pulley 196 located in the +Z direction with respect to the base 44 in the +Z direction. The cleaning units 61, 62, and 63 are moved by, for example, rotating at least one of the pullies 194 and 196 in forward and reverse directions. A structure in which the cleaning units 61, 62, and 63 are moved by a driving mechanism is not limited to that illustrated in FIG. 12, and various structures may be used.

In the present exemplary embodiment, the connecting part 90 is located further in the −Z direction than the one end 44A (end in the −Z direction) of the base 44. However, the connecting part 90 is not limited to this. For example, the connecting part 90 may instead be located further in the +Z direction than the one end 44A (end in the −Z direction) of the base 44.

In the present exemplary embodiment, the support part 71 supports the extending part 64 such that the extending part 64 is movable in the −+Z directions. In the present exemplary embodiment, the support part 72 supports both of the extending parts 64 and 65 such that the extending parts 64 and 65 are movable in the −+Z directions. However, the extending parts 64 and 65 are not limited to this. For example, the extending parts 64 and 65 may not be supported.

In the present exemplary embodiment, the support part 73 supports the coupling part 69 such that the coupling part 69 is movable in the −+Z directions. However, the coupling part 69 is not limited to this. For example, the coupling part 69 may not be supported.

In the present exemplary embodiment, the support parts 71, 72, and 73 are provided on the base 44. However, the support parts 71, 72, and 73 are not limited to this. For example, the support parts 71, 72, and 73 may instead be provided on a member other than the base 44.

In the present exemplary embodiment, the support parts 71, 72, and 73 are not fixed to the side coverings 45 and 46. However, the support parts 71, 72, and 73 are not limited to this. For example, the support parts 71, 72, and 73 may be attached to the side coverings 45 and 46.

In the present exemplary embodiment, the support part 72 supports both of the extending parts 64 and 65 such that the extending parts 64 and 65 are movable in the −+Z directions. However, the extending parts 64 and 65 are not limited to this. For example, the extending parts 64 and 65 may instead be supported by different support parts.

Second Exemplary Embodiment

Figure 13:
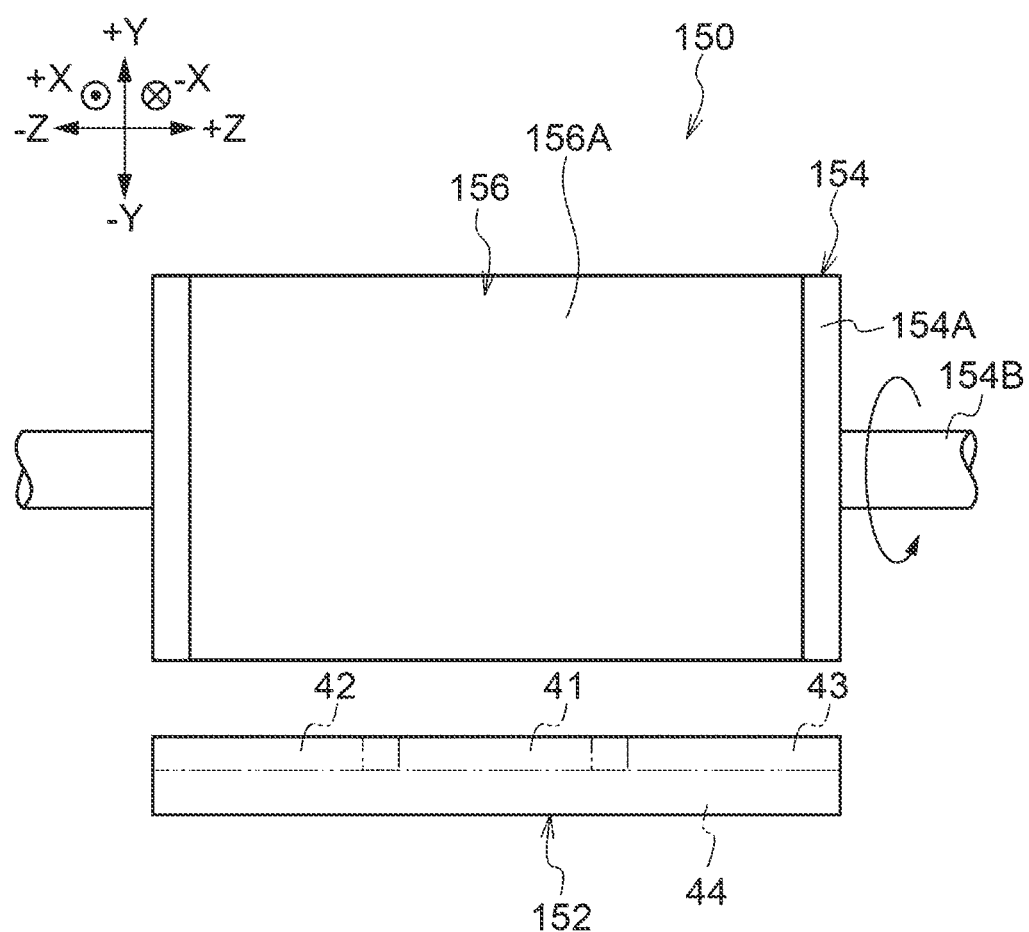
FIG. 13 illustrates the structure of a rendering apparatus including a light-emitting device according to a second exemplary embodiment.

FIG. 13 illustrates a rendering apparatus 150 including a light-emitting device 152 according to a second exemplary embodiment. Components having the same structures as those in the first exemplary embodiment are denoted by the same reference signs, and description thereof is omitted as appropriate.

As illustrated in FIG. 13, the rendering apparatus 150 includes the light-emitting device 152 and a cylindrical member 154. The cylindrical member 154 extends in the longitudinal direction of the light-emitting device 152 and rotates in a circumferential direction.

The light-emitting device 152 has the same structure as that of the exposure device 40 according to the first exemplary embodiment. More specifically, the light-emitting device 152 includes a base 44 that extends in the Z direction and light-emitting units 41, 42, and 43.

The cylindrical member 154 includes a cylindrical portion 154A and a shaft portion 154B that projects from both sides of the cylindrical portion 154A. The shaft portion 154B is rotatably supported by a frame (not illustrated). The shaft portion 154B is rotated to rotate the cylindrical portion 154A in the circumferential direction.

A substrate 156 is attached to a surface of the cylindrical portion 154A. A surface of the substrate 156 has a region 156A in which a photosensitive material is provided. The substrate 156 is, for example, a plate for computer-to-plate (CTP) used in a plate making process for offset printing. The region 156A in which the photosensitive material is provided is, for example, a region in which the photosensitive material, such as photoresist, used in a process of manufacturing a printed wiring board (PWB) is applied.

In the rendering apparatus 150, the cylindrical member 154 is rotated while the region 156A of the substrate 156 in which the photosensitive material is provided is irradiated with light emitted from the light-emitting device 152 in a predetermined pattern. Thus, the predetermined pattern is formed in the region 156A of the substrate 156 in which the photosensitive material is provided. After that, the substrate 156 is developed to obtain a printing plate for use by an offset printer. In this case, a laser device, for example, may be used as a light source of the rendering apparatus 150.

The above-described light-emitting device 152 has the same operation and effects as those of the exposure device 40 according to the first exemplary embodiment.

In the rendering apparatus 150 according to the second exemplary embodiment, the substrate 156 attached to the cylindrical portion 154A of the cylindrical member 154 is irradiated with light emitted from the light-emitting device 152. However, the present disclosure is not limited to this structure. For example, the substrate may be disposed on a flat plate-shaped table and irradiated with light from the light-emitting device 152 while the light-emitting device 152 and the table are moved relative to each other in a direction crossing the one direction of the light-emitting device 152.

In addition, in the rendering apparatus 150 according to the second exemplary embodiment, the substrate 156 is a plate for CTP used in a plate making process for offset printing, and the region 156A of the substrate 156 in which the photosensitive material is provided is irradiated with light from the light-emitting device 152. However, the rendering apparatus 150 is not limited to this. For example, the light-emitting device and the rendering apparatus described above may instead be used in an exposure process for manufacturing a printed wiring board (PWB). For example, a substrate to which a photosensitive material, such as photoresist, is applied may be subjected to a process of directly forming a pattern on the substrate without using a photomask to manufacture a printed wiring board. The substrate that is used may be a rigid substrate or a flexible substrate. When a flexible substrate is used, the substrate may be fixed to the cylindrical member 154 illustrated in FIG. 13, and the pattern may be formed while the cylindrical member 154 is rotated.

The light-emitting device and the rendering apparatus described above may be used to process a component by photolithography. For example, the light-emitting device and the rendering apparatus may be used in formation of a color filter in a process of manufacturing a liquid crystal display (LCD); exposure of a dry film resist (DFR) in a process of manufacturing a thin film transistor (TFT); exposure of a dry film resist (DFR) in a process of manufacturing a plasma display panel (PDP); exposure of a photosensitive material, such as photoresist, in a process of manufacturing a semiconductor device; exposure of a photosensitive material, such as photoresist, in a process of manufacturing a printing plate; or exposure of a photosensitive material in a process of manufacturing a timepiece component. Here, photolithography is a technology for exposing a surface of an object on which a photosensitive material is provided to patterned light to form a pattern including exposed and unexposed portions.

The light-emitting device and the rendering apparatus described above are applicable to both a photon-mode photosensitive material, on which information is recorded directly by exposure to light, and a heat-mode photosensitive material, on which information is recorded by heat generated as a result of exposure to light. The light source of the rendering apparatus 150 may be, for example, an LED device or a laser device depending on the object exposed to light.

The light-emitting device is applicable to various devices, such as a light source of a distance measurement device that measures a distance, a light source of a display device, such as a laser projector, or a drying device that dries ink by irradiating the ink with light in an inkjet recording apparatus.

The present disclosure is not limited to the above-described exemplary embodiments, and various modifications, alterations, and improvements are possible without departing from the spirit of the present disclosure. For example, the above-described modifications may be applied in combinations with each other as appropriate.

The foregoing description of the exemplary embodiments of the present disclosure has been provided for the purposes of illustration and description. It is not intended to be exhaustive or to limit the disclosure to the precise forms disclosed. Obviously, many modifications and variations will be apparent to practitioners skilled in the art. The embodiments were chosen and described in order to best explain the principles of the disclosure and its practical applications, thereby enabling others skilled in the art to understand the disclosure for various embodiments and with the various modifications as are suited to the particular use contemplated. It is intended that the scope of the disclosure be defined by the following claims and their equivalents.

What is claimed is:

1. A light-emitting device comprising:
    a first light-emitting unit that extends in one direction and that has a first emission surface located along the one direction, the first emission surface emitting light;
    a second light-emitting unit that is located in the one direction with respect to the first light-emitting unit, that extends in the one direction, and that has a second emission surface located along the one direction, the second emission surface emitting light;
    a first cleaning unit that is capable of moving in the one direction and an opposite direction that is opposite to the one direction to clean the first emission surface;
    a second cleaning unit that is capable of moving in the one direction and the opposite direction to clean the second emission surface; and
    a transmission unit that extends from the first cleaning unit and the second cleaning unit in the one direction and that transmits a moving force for moving the first cleaning unit and the second cleaning unit to the first cleaning unit and the second cleaning unit, wherein
    the second light-emitting unit is disposed at a position shifted from the first light-emitting unit in a width direction;
    the width direction is a direction that crosses a light-emitting direction, in which the first light-emitting unit and the second light-emitting unit emit light, and the one direction; and
    the transmission unit includes:
        a first extending part that extends from the first cleaning unit in the one direction,
        a second extending part that extends from the second cleaning unit in the one direction, and
        a connecting part that connects the first extending part and the second extending part to each other.

2. The light-emitting device according to claim 1, wherein the first light-emitting unit and the second light-emitting unit are aligned along the one direction, and
    wherein the transmission unit includes:
        a coupling part that extends from the first cleaning unit in the one direction and that is coupled to the second cleaning unit; and
        an extending part that extends from the second cleaning unit in the one direction.

3. The light-emitting device according to claim 2, wherein the transmission unit includes a rod including the coupling part and the extending part that are integrated together, the rod extending in the one direction.

4. The light-emitting device according to claim 1, wherein the connecting part serves as a handle.

5. The light-emitting device according to claim 4, further comprising:
    a base located in a direction opposite to the light-emitting direction with respect to the first light-emitting unit, the base having the first light-emitting unit and the second light-emitting unit placed thereon,
    wherein the connecting part is located further in the one direction than an end of the base in the one direction.

6. The light-emitting device according to claim 4, further comprising:
    a positioning part located in the one direction with respect to the second light-emitting unit, the positioning part coming into contact with an irradiation target to position the second light-emitting unit with respect to the irradiation target,
    wherein the first extending part and the second extending part extend in the one direction at positions shifted from the positioning part in the width direction.

7. The light-emitting device according to claim 4, wherein the first light-emitting unit and the second light-emitting unit are inclined so as to be a down slope toward inside of the width direction opposite each other when viewed in the one direction,
    wherein the first extending part extends in the one direction at a position on an outer side of the first light-emitting unit in the width direction, and
    wherein the second extending part extends in the one direction at a position on an outer side of the second light-emitting unit in the width direction.

8. The light-emitting device according to claim 5,
    wherein each of the first light-emitting unit and the second light-emitting unit includes:
        a light-emitting member that emits light in the light-emitting direction; and
        a body that supports the light-emitting member at a side of the light-emitting member in the direction opposite to the light-emitting direction, the body being constituted by a metal block, and
    wherein the base is a metal block to which the body is attached at a side of the body in the direction opposite to the light-emitting direction.

9. The light-emitting device according to claim 5, further comprising:
    a positioning part located in the one direction with respect to the second light-emitting unit, the positioning part coming into contact with an irradiation target to position the second light-emitting unit with respect to the irradiation target,
    wherein the first extending part and the second extending part extend in the one direction at positions shifted from the positioning part in the width direction.

10. The light-emitting device according to claim 8, further comprising:
    a positioning part located in the one direction with respect to the second light-emitting unit, the positioning part coming into contact with an irradiation target to position the second light-emitting unit with respect to the irradiation target,
    wherein the first extending part and the second extending part extend in the one direction at positions shifted from the positioning part in the width direction.

11. The light-emitting device according to claim 1, further comprising:
    a base located in a direction opposite to the light-emitting direction with respect to the first light-emitting unit, the base having the first light-emitting unit and the second light-emitting unit placed thereon,
wherein the connecting part is located further in the one direction than an end of the base in the one direction.

12. The light-emitting device according to claim 11, wherein each of the first light-emitting unit and the second light-emitting unit includes:
a light-emitting member that emits light in the light-emitting direction; and
a body that supports the light-emitting member at a side of the light-emitting member in the direction opposite to the light-emitting direction, the body being constituted by a metal block, and
wherein the base is a metal block to which the body is attached at a side of the body in the direction opposite to the light-emitting direction.

13. The light-emitting device according to claim 11, further comprising:
a positioning part located in the one direction with respect to the second light-emitting unit, the positioning part coming into contact with an irradiation target to position the second light-emitting unit with respect to the irradiation target,
wherein the first extending part and the second extending part extend in the one direction at positions shifted from the positioning part in the width direction.

14. The light-emitting device according to claim 11, wherein the first light-emitting unit and the second light-emitting unit are inclined so as to be a down slope toward inside of the width direction opposite each other when viewed in the one direction,
wherein the first extending part extends in the one direction at a position on an outer side of the first light-emitting unit in the width direction, and
wherein the second extending part extends in the one direction at a position on an outer side of the second light-emitting unit in the width direction.

15. The light-emitting device according to claim 12, further comprising:
a positioning part located in the one direction with respect to the second light-emitting unit, the positioning part coming into contact with an irradiation target to position the second light-emitting unit with respect to the irradiation target,
wherein the first extending part and the second extending part extend in the one direction at positions shifted from the positioning part in the width direction.

16. The light-emitting device according to claim 1, further comprising:
a positioning part located in the one direction with respect to the second light-emitting unit, the positioning part coming into contact with an irradiation target to position the second light-emitting unit with respect to the irradiation target,
wherein the first extending part and the second extending part extend in the one direction at positions shifted from the positioning part in the width direction.

17. The light-emitting device according to claim 1, wherein the first light-emitting unit and the second light-emitting unit are inclined so as to be a down slope toward inside of the width direction opposite each other when viewed in the one direction,
wherein the first extending part extends in the one direction at a position on an outer side of the first light-emitting unit in the width direction, and
wherein the second extending part extends in the one direction at a position on an outer side of the second light-emitting unit in the width direction.

18. The light-emitting device according to claim 1, further comprising:
a third light-emitting unit that is disposed at a position shifted from the first light-emitting unit in the opposite direction and the width direction, that is aligned with the second light-emitting unit along the one direction, that extends in the one direction, and that has a third emission surface located along the one direction, the third emission surface emitting light; and
a third cleaning unit that is capable of moving in the one direction and the opposite direction to clean the third emission surface,
wherein the transmission unit further includes:
a coupling part that extends from the third cleaning unit in the one direction and that is coupled to the second cleaning unit.

19. A light-emitting device comprising:
a first light-emitting unit that includes a first emission surface located along one direction and emitting light;
a second light-emitting unit that is located in the one direction with respect to the first light-emitting unit and that includes a second emission surface located along the one direction, the second emission surface emitting light;
a first cleaning unit that cleans the first emission surface;
a second cleaning unit that cleans the second emission surface; and
a transmission unit to which the first cleaning unit and the second cleaning unit are connected and that transmits a moving force for moving the first cleaning unit and the second cleaning unit along the one direction to the first cleaning unit and the second cleaning unit, wherein
the second light-emitting unit is disposed at a position shifted from the first light-emitting unit in a width direction;
the width direction is a direction that crosses a light-emitting direction, in which the first light-emitting unit and the second light-emitting unit emit light, and the one direction; and
the transmission unit includes:
a first extending part that extends from the first cleaning unit in the one direction,
a second extending part that extends from the second cleaning unit in the one direction, and
a connecting part that connects the first extending part and the second extending part to each other.

* * * * *